(12) United States Patent
Lee et al.

(10) Patent No.: US 9,379,329 B2
(45) Date of Patent: Jun. 28, 2016

(54) LOW BAND-GAP ORGANIC SEMICONDUCTOR COMPOUNDS, AND TRANSISTORS AND ELECTRONIC DEVICES INCLUDING THE SAME

(75) Inventors: Bang Lin Lee, Suwon-si (KR); Jeong-il Park, Seongnam-si (KR); Jong Won Chung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1188 days.

(21) Appl. No.: 13/211,810

(22) Filed: Aug. 17, 2011

(65) Prior Publication Data

US 2012/0168727 A1   Jul. 5, 2012

(30) Foreign Application Priority Data

Jan. 4, 2011 (KR) .................. 10-2011-0000692

(51) Int. Cl.

| | |
|---|---|
| H01L 51/30 | (2006.01) |
| C08F 228/06 | (2006.01) |
| H01L 51/00 | (2006.01) |
| B82Y 10/00 | (2011.01) |
| C08G 61/12 | (2006.01) |
| C09B 69/10 | (2006.01) |
| H01L 51/05 | (2006.01) |
| H01L 51/42 | (2006.01) |

(52) U.S. Cl.
CPC ............ *H01L 51/0036* (2013.01); *B82Y 10/00* (2013.01); *C08G 61/122* (2013.01); *C08G 61/123* (2013.01); *C09B 69/109* (2013.01); *H01L 51/0043* (2013.01); *C08G 2261/124* (2013.01); *C08G 2261/3223* (2013.01); *C08G 2261/3241* (2013.01); *C08G 2261/3243* (2013.01); *C08G 2261/414* (2013.01); *C08G 2261/91* (2013.01); *C08G 2261/92* (2013.01); *H01L 51/0047* (2013.01); *H01L 51/0558* (2013.01); *H01L 51/4253* (2013.01); *Y02E 10/549* (2013.01)

(58) Field of Classification Search
USPC ............... 257/40, E51.025; 526/256, 257
See application file for complete search history.

(56) References Cited

U.S. PATENT DOCUMENTS

| | | |
|---|---|---|
| 5,946,551 A | 8/1999 | Dimitrakopoulos et al. |
| 6,232,157 B1 | 5/2001 | Dodabalapur et al. |
| 7,030,409 B2 | 4/2006 | Lee et al. |
| 7,534,503 B2 | 5/2009 | Burroughes et al. |
| 7,541,424 B2 | 6/2009 | Jeong et al. |
| 7,923,529 B2 | 4/2011 | Jeong et al. |
| 8,334,456 B2 | 12/2012 | Zhu et al. |
| 8,372,315 B2 | 2/2013 | Beaujuge et al. |
| 8,501,901 B2 | 8/2013 | Kitazawa et al. |
| 8,530,889 B2 | 9/2013 | Jo et al. |
| 8,558,108 B2 | 10/2013 | Kitazawa et al. |
| 8,598,449 B2 | 12/2013 | Pan et al. |
| 8,748,739 B2 | 6/2014 | Zhu et al. |
| 2006/0076050 A1 | 4/2006 | Williams et al. |
| 2006/0081839 A1 | 4/2006 | Jeong et al. |
| 2006/0237695 A1 | 10/2006 | Williams et al. |
| 2008/0099758 A1 | 5/2008 | Lee et al. |
| 2008/0262183 A1 | 10/2008 | Lehmann |
| 2010/0078074 A1 | 4/2010 | Yang et al. |
| 2010/0307594 A1 | 12/2010 | Zhu et al. |
| 2011/0001131 A1* | 1/2011 | Lee et al. .................... 257/40 |
| 2011/0023964 A1* | 2/2011 | Kitazawa ............ C07D 417/14 136/263 |
| 2011/0121273 A1* | 5/2011 | Jo et al. ...................... 257/40 |

FOREIGN PATENT DOCUMENTS

| | | |
|---|---|---|
| CN | 1 763 035 A | 4/2006 |
| JP | 2004-534863 A | 11/2004 |
| JP | 2005-171243 A | 6/2005 |
| JP | 2006-117672 A | 5/2006 |
| JP | 2008-208289 A | 9/2008 |
| JP | 2010-111649 A | 5/2010 |
| JP | 2012-138557 A | 7/2012 |
| WO | WO-2009/125647 A1 | 10/2009 |
| WO | WO-2009/139339 A1 | 11/2009 |
| WO | WO-2010/084865 A1 | 7/2010 |
| WO | WO-2010/135701 A1 | 11/2010 |
| WO | WO-2010/138566 A2 | 12/2010 |

OTHER PUBLICATIONS

Pei-Tzu Wu, et al. "Conjugated Donor#Acceptor Copolymer Semiconductors. Synthesis, Optical Properties, Electrochemistry, and Field-Effect Carrier Mobility of Pyridopyrazine-Based Copolymers." Macromolecules, 2008, 41 (19), pp. 7021-7028.

Nicolas Blouin, et al. "Toward a Rational Design of Poly(2,7-Carbazole) Derivatives for Solar Cells." Journal of American Chemical Society, 2008, 130, pp. 732-742.

C.J. Du Bois, Jr., et al. "Multi-colored electrochromic polymers based on BEDOT-pyridines." Synthetic Metals, 2001, 119, pp. 321-322.

(Continued)

*Primary Examiner* — Kristin Vajda

(74) *Attorney, Agent, or Firm* — Harness, Dickey & Pierce, P.L.C.

(57) ABSTRACT

An organic semiconductor compound including a structural unit represented by Chemical Formula 1.

[Chemical Formula 1]

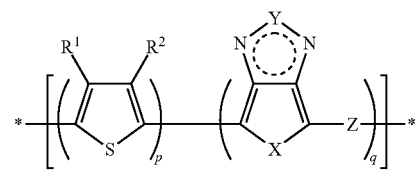

16 Claims, 7 Drawing Sheets

(56) References Cited

OTHER PUBLICATIONS

Bang-Lin Lee, et al. "Syntheses of New Alternating CT-Type Copolymer of Thiophene and Pyrido [3,4-*b*]pyrazine Units: Their Optical and Electrochemical Properties in Comparison with Similar CT Copolymers of Thiophene with Pyridine and Quinoxaline." Macromolecules, 1999, 32, pp. 1375-1382.

Takakazu Yamamoto, et al. "New Soluble, Coplanar Poly(naphthalene-2, 6-diyl)-Type π-Conjugated Polymer, Poly(prymido[5,4-*d*]pyrimidine-2, 6-diyl), with Nitrogen Atoms at All of the *o*-Positions. Synthesis, Solid Structure, Optical Properties, Self-Assembling Phenomena, and Redox Behavior." Macromolecules, 2002, 35, pp. 2993-2999.

Sung Heum Park, et al. "Bulk heterojunction solar cells with internal quantum efficiency approaching 100%." Nature Photonics, May 2009, vol. 3, pp. 297-303.

Martijn M. Wienk, et al. "Narrow-Bandgap Diketo-Pyrrolo-Pyrrole Polymer Solar Cells: The Effect of Processing on the Performance." Advanced Materials, 2008, 20, pp. 2556-2560.

Chiem van Pham, et al. "Lithiation Reaction of 2,5-Dibromothiophene. $^{13}$C NMR Spectra of 3-Subsituted Derivatives." Journal of Organic Chemistry, 1984, 49, pp. 5250-5253.

Office Action dated Apr. 10, 2012 issued in corresponding European Application No. 12150078.9.

Jianhui Hou et al., "Bandgap and Molecular Energy Level Control of Conjugated Polymer Photovoltaic Materials Based on Benzo[1,2-*b*:4,5-*b'*]dithiophene," *Macromolecules*, vol. 41, No. 16, pp. 6012-6018, (2008).

Chinese Office Action mailed on Jan. 30, 2015, and English Translation thereof.

Japanese Office Action mailed on Feb. 24, 2015, and English Translation thereof.

"Low Bandgap Polymers Synthesized by FeCl3 Oxidative Polymerization;" Tianqi Cai et al.; Solar Energy Materials & Solar Cells, Sep. 4, 2010(7), p. 1275-1281.

\* cited by examiner

LOW BAND-GAP ORGANIC SEMICONDUCTOR COMPOUNDS, AND TRANSISTORS AND ELECTRONIC DEVICES INCLUDING THE SAME

CROSS-REFERENCE TO RELATED APPLICATION

This application claims priority under 37 U.S.C. §119 to Korean Patent Application No. 10-2011-0000692, filed on Jan. 4, 2011 in the Korean Intellectual Property Office (KIPO), the entire contents of which is incorporated herein by reference.

BACKGROUND

1. Field

Example embodiments relate to low band gap organic semiconductor compounds, transistors including the same and/or electronic devices including the same.

2. Description of the Related Art

As a society becomes information-oriented, development of a new image display device that overcomes the drawbacks of a conventional cathode ray tube (CRT) (e.g., heavy weight and large volume) may be required. Accordingly, various flat panel displays such as a liquid crystal display (LCD), an organic light emitting diode (OLED) display, a plasma display panel (PDP), a surface-conduction electron-emitter display (SED), and so on, are drawing attention.

As for a switching device of the flat panel displays, a thin film transistor (TFT) including amorphous silicon as a semiconductor layer is widely used. The amorphous silicon thin film transistor is widely used because it may have good uniformity and high electrical properties in a doping state, but good insulating properties in a non-doping state. However, in order to deposit a conventional amorphous silicon thin film transistor on a substrate, the deposition process may be performed at a relatively high temperature of about 300° C. Therefore, this process is difficult to apply to low-temperature substrates (e.g., polymer substrates and the like) to accomplish a flexible display.

An organic thin film transistor (OTFT) using an organic semiconductor material has been suggested. The organic thin film transistor generally includes a substrate, a gate electrode, an insulation layer, a source electrode, a drain electrode, and a channel region. The organic thin film transistor may be classified into a bottom contact (BC) type in which a channel region is formed on the source electrode and the drain electrode and a tap contact (TC) type in which a metal electrode is formed beneath the channel region due to mask deposition and the like.

The low molecular or oligomer organic semiconductor material filled in the channel region of the organic thin film transistor (OTFT) may include merocyanine, phthalocyanine, perylene, pentacene, C60, a thiophene oligomer, and so on. The low molecular or oligomer organic semiconductor material may be a thin film formed on the channel region mainly according to a vacuum process. On the other hand, an organic semiconductor polymer material has a workability advantage of large-area processing with a low cost in a solution method such as printing techniques.

SUMMARY

At least some example embodiments may provide organic semiconductor compounds with excellent and/or improved charge mobility fabricated using a solution process. Other example embodiments may provide transistors including the organic semiconductor compounds. Further example embodiments may provide electronic devices including the organic semiconductor compounds.

According to some example embodiments, an organic semiconductor compound includes a structural unit represented by the following Chemical Formula 1.

[Chemical Formula 1]

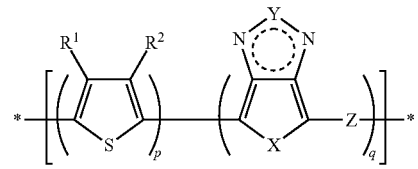

In Chemical Formula 1, $R^1$ and $R^2$ are each independently selected from hydrogen, a halogen, a substituted or unsubstituted C1-C20 linear or branched alkyl group, a substituted or unsubstituted C3-C20 cycloalkyl group, a substituted or unsubstituted linear or branched C1-C20 alkoxy group, a substituted or unsubstituted C3-C20 cycloalkyloxy group, a substituted or unsubstituted C6-C30 aryl group, a substituted or unsubstituted C6-C30 aryloxy group, a substituted or unsubstituted C2-C30 heteroaryl group, and a combination thereof, or a C1-C20 alkyl group, a C1-C20 alkoxy group, or a C3-C20 cycloalkyl group where one $CH_2$ group or two or more non-adjacent $CH_2$ groups are optionally substituted with —O—, —S—, —S(O)$_2$—, —CO—, —OCO—, —C(O)O—, —CR$^{51}$═CR$^{52}$—, —C≡C—, and —SiR$^{53}$R$^{54}$— (where $R^{51}$-$R^{54}$ are each independently selected from hydrogen, a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof), provided that $R^1$ is not hydrogen.

X is each independently selected from —CR$^3$═N—, —N═N—, —CR$^4$═CR$^5$—, —O—, —S—, —Se—, and —NR$^6$—, Y is selected from —CR$^7$═CR$^8$—, —O—, —S—, —Se—, and —NR$^9$—, $R^3$ to $R^9$ are each independently selected from hydrogen, a halogen, a substituted or unsubstituted C1-C20 linear or branched alkyl group, a substituted or unsubstituted C3-C20 cycloalkyl group, a substituted or unsubstituted linear or branched C1-C20 alkoxy group, a substituted or unsubstituted C3-C20 cycloalkyloxy group, a substituted or unsubstituted C6-C30 aryl group, a substituted or unsubstituted C6-C30 aryloxy group, a substituted or unsubstituted C2-C30 heteroaryl group, and a combination thereof; a C10-C20 alkyl group, a C1-C20 alkoxy group, or a C3-C20 cycloalkyl group where one $CH_2$ group or two or more non-adjacent $CH_2$ groups are optionally substituted with —O—, —S—, —S(O)$_2$—, —CO—, —OCO—, —C(O)O—, —CR$^{51}$═CR$^{52}$—, —C≡C— and —SiR$^{53}$R$^{54}$— (where $R^{51}$-$R^{54}$ are each independently selected from hydrogen, a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof); or when Y is —CR$^7$═CR$^8$—, adjacent $R^7$ and Ware linked to each other to provide a fused ring, Z is a substituted or unsubstituted C1-C40 arylene group, a substituted or unsubstituted C4-C14 heteroaromatic ring group, or a substituted or unsubstituted C6-C30 condensed polycyclic group including a heteroaromatic ring group, and p and q denotes a mole ratio of each structural unit, and p/(p+q) ranges from about 0.5 to about 0.95.

The organic semiconductor compound may include a structural unit represented by the following Chemical Formula 2.

[Chemical Formula 2]

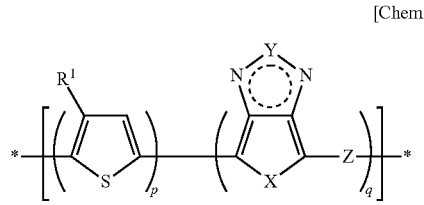

In Chemical Formula 2, $R^1$, X, Y, Z, p, and q are the same as in Chemical Formula 1. In Chemical Formulae 1 and 2, p/(p+q) may range from about 0.5 to about 0.95. In Chemical Formulae 1 and 2, the structural unit represented by the following Chemical Formula 1A may be selected from the structural units represented by the following Chemical Formula 3.

[Chemical Formula 1A]

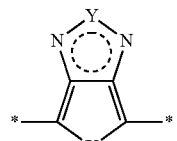

[Chemical Formula 3]

(3-1)

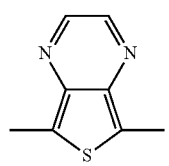

(3-2)

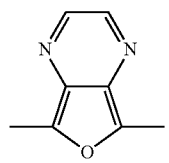

(3-3)

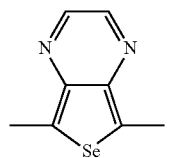

(3-4)

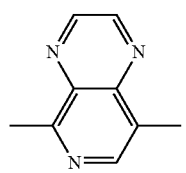

(3-5)

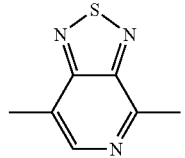

(3-6)

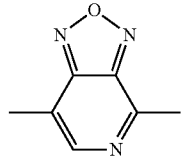

(3-7)

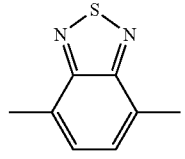

(3-8)

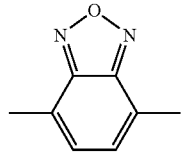

(3-9)

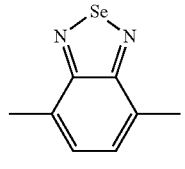

(3-10)

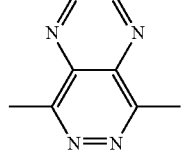

(3-11)

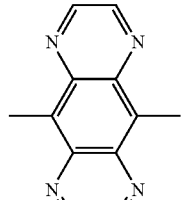

(3-12)

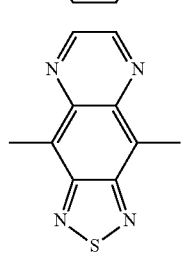

Hydrogen in each ring of Chemical Formula 3 may be substituted with a substituent selected from a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof. In Chemical Formulae 1 and 2, a —Z— structural unit is at least one of the structural units represented by the following Chemical Formula 4.

[Chemical Formula 4]

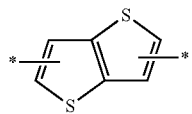
(4-1)

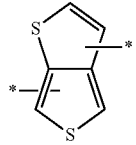
(4-2)

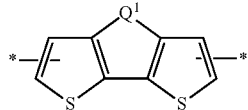
(4-3)

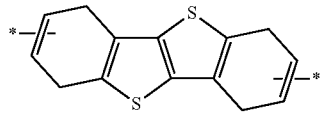
(4-4)

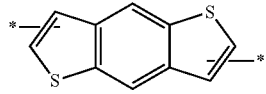
(4-5)

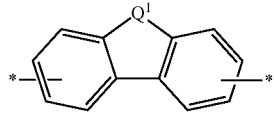
(4-6)

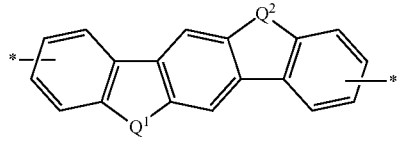
(4-7)

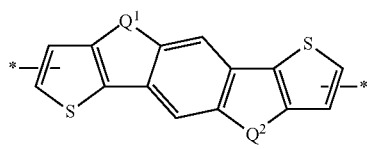
(4-8)

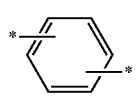
(4-9)

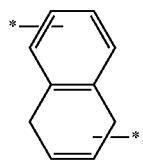
(4-10)

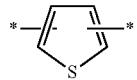
(4-11)

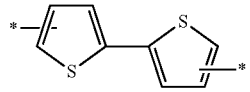
(4-12)

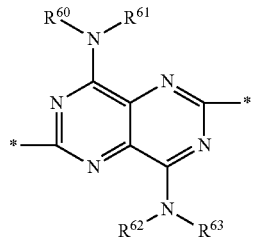
(4-13)

In Chemical Formula 4, $Q^1$ and $Q^2$ are each S, $CR^{64}R^{65}$, $NR^{66}$ or $SiR^{67}R^{68}$, where $R^{60}$-$R^{68}$ are each independently selected from hydrogen, a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof, and hydrogen in each ring of Chemical Formula 4 may be substituted with a substituent selected from a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof.

The organic semiconductor compound including the structural unit of Chemical Formula 1 or the structural unit of Chemical Formula 2 may include a structural unit represented by the following Chemical Formula 5.

[Chemical Formula 5]

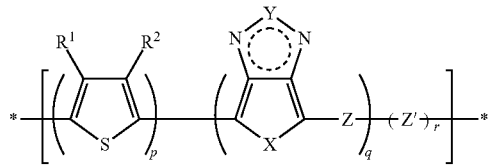

In Chemical Formula 5, $R^1$, $R^2$, X, Y, Z, p, and q are the same as in Chemical Formula 1, Z' is at least one of functional groups represented by the above Chemical Formula 4, and Z' is different from Z, and r/(p+q+r) is in a range of about 0.2 or less and specifically about 0.05 to about 0.15. The structural unit of Chemical Formula 1A in Chemical Formula 1 may be at least one of Chemical Formulae 3-1, 3-4, and 3-7, and the —Z— structural unit in Chemical Formula 1 may be one of Chemical Formulae 4-1, 4-3, 4-5, 4-6, 4-8, 4-10, 4-11, or 4-12.

The organic semiconductor compound including the structural unit represented by Chemical Formula 1 may include at least one of structural units represented by the following Chemical Formula 6.

[Chemical Formula 6]
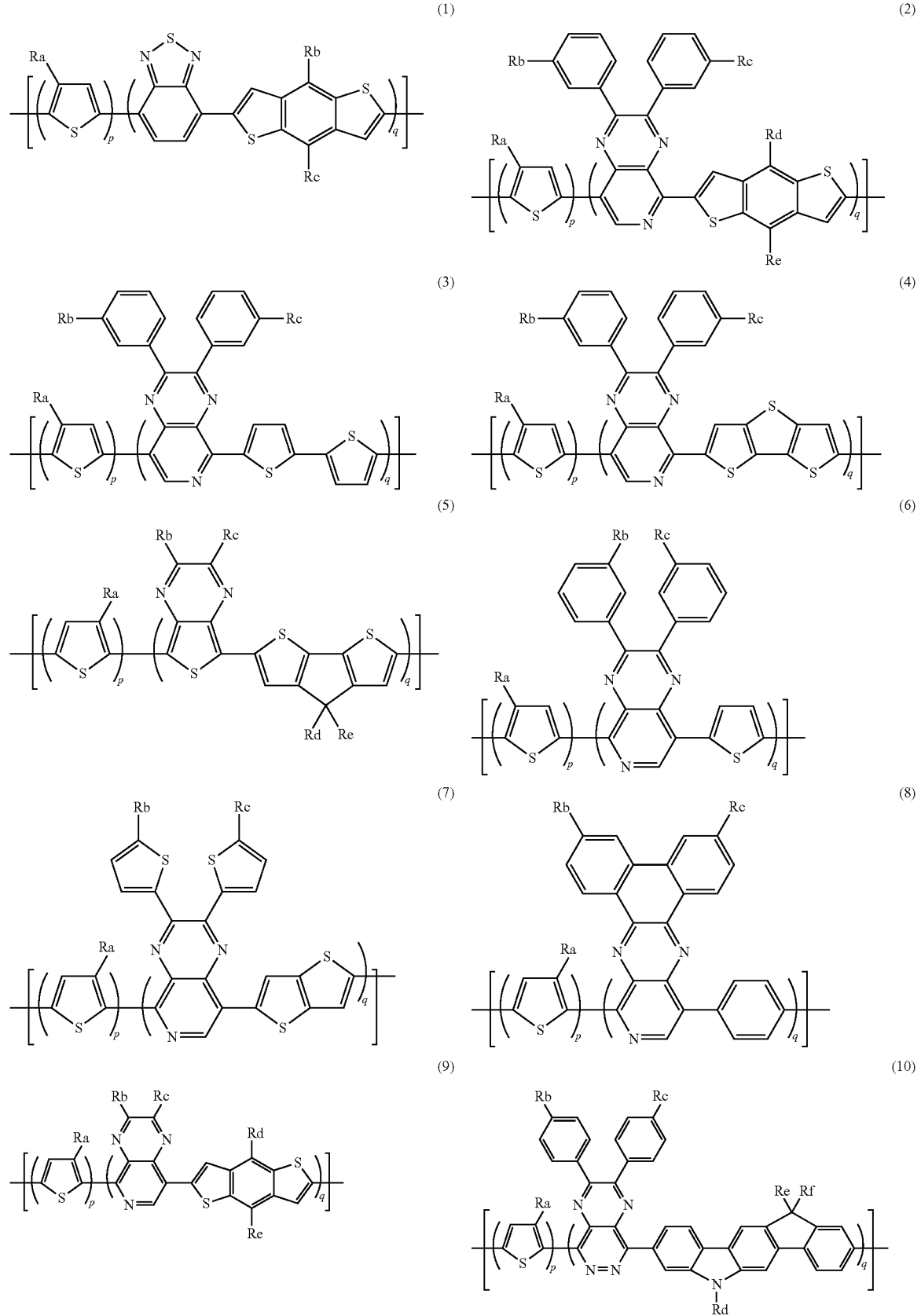

-continued

(11)
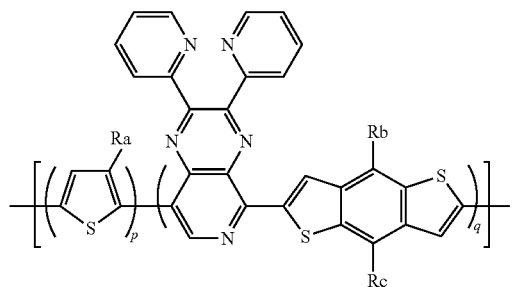

(12)
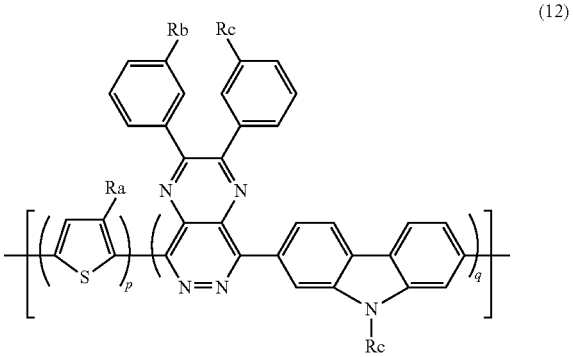

(13)
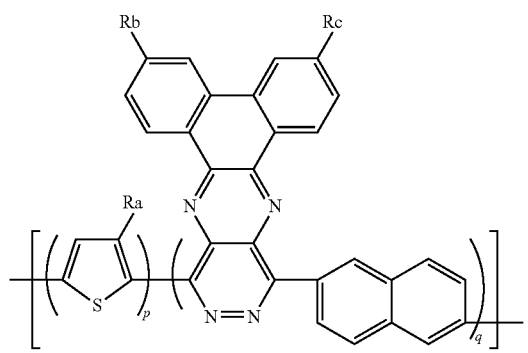

(14)
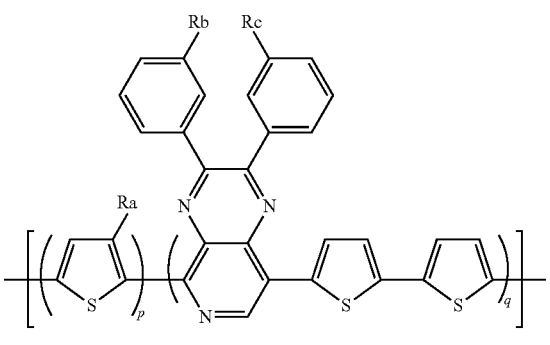

(15)
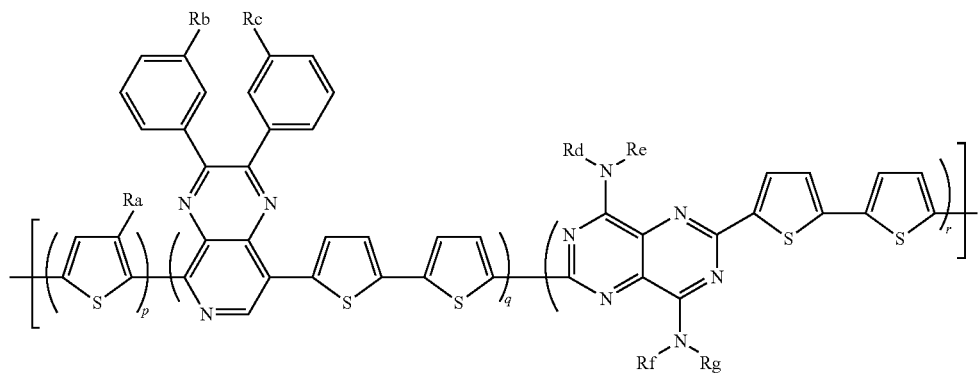

In Chemical Formula 6, Ra-Rg are each independently selected from hydrogen, a substituted or unsubstituted C1-C20 linear or branched alkyl group, or a substituted or unsubstituted C1-C20 linear or branched alkoxy group, p/(p+q) ranges from about 0.5 to about 0.95, and r/(p+q+r) is about 0.2 or less. The organic semiconductor compound may have a number average molecular weight (Mn) of about 5,000 to about 200,000, and a weight average molecular weight (Mn) of about 10,000 to about 500,000. The organic semiconductor compound may be a p-type organic semiconductor compound.

According to other example embodiments, a transistor including the organic semiconductor compound is provided. The transistor includes a gate electrode positioned on a substrate, a source electrode and a drain electrode facing each other and defining a channel region, an insulation layer that electrically insulates the source electrode and drain electrode from the gate electrode, and an active layer including the organic semiconductor compound in the channel region. According to still other example embodiments, an electronic device including the organic semiconductor compound is provided. The electronic device may be an organic solar cell.

According to at least one example embodiment, an organic semiconductor compound includes at least one structural unit according to Chemical Formula 1, where, in Chemical Formula 1, $R^1$ and $R^2$ are each independently one of selected from hydrogen, a halogen, one of a substituted and unsubstituted C1-C20 linear or branched alkyl group, one of a substituted and unsubstituted C3-C20 cycloalkyl group, one of a substituted and unsubstituted linear or branched C1-C20 alkoxy group, one of a substituted and unsubstituted C3-C20 cycloalkyloxy group, one of a substituted and unsubstituted C6-C30 aryl group, one of a substituted and unsubstituted C6-C30 aryloxy group, one of a substituted and unsubstituted C2-C30 heteroaryl group, and a combination thereof, and selected from a C1-C20 alkyl group, a C1-C20 alkoxy group, and a C3-C20 cycloalkyl group.

One of one $CH_2$ group and a plurality of non-adjacent $CH_2$ groups are, if $R^1$ is not hydrogen, optionally substituted with —O—, —S—, —S(O)$_2$—, —CO—, —OCO—, —C(O)O—, —CR$^{51}$=CR$^{52}$—, —C≡C—, and —SiR$^{53}$R$^{54}$—, where $R^{51}$-$R^{54}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof, each X is independently selected from —$CR^3$=N—, —N=N—, —$CR^4$=$CR^5$—, —O—, —S—, —Se—, and —$NR^6$—.

Y is selected from —$CR^7$=$CR^8$—, —O—, —S—, —Se—, and —$NR^9$—, $R^3$-$R^9$ are each independently one of selected from hydrogen, a halogen, one of a substituted and unsubstituted C1-C20 linear or branched alkyl group, one of a substituted and unsubstituted C3-C20 cycloalkyl group, one of a substituted and unsubstituted linear or branched C1-C20 alkoxy group, one of a substituted and unsubstituted C3-C20 cycloalkyloxy group, one of a substituted and unsubstituted C6-C30 aryl group, one of a substituted and unsubstituted C6-C30 aryloxy group, one of a substituted and unsubstituted C2-C30 heteroaryl group, and a combination thereof, selected from a C1-C20 alkyl group, a C1-C20 alkoxy group, and a C3-C20 cycloalkyl group, where one of one $CH_2$ group and a plurality of non-adjacent $CH_2$ groups are optionally substituted with —O—, —S—, —S(O)$_2$—, —CO—, —OCO—, —C(O)O—, —$CR^{51}$=$CR^{52}$—, —C≡C— and —$SiR^{53}R^{54}$—.

$R^{51}$-$R^{54}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof, and when Y is —$CR^7$=$CR^8$—, adjacent $R^7$ and $R^8$ are linked to each other in a fused ring, Z is selected from one of a substituted and unsubstituted C1-C40 arylene group, one of a substituted and unsubstituted C4-C14 heteroaromatic ring group, and one of a substituted and unsubstituted C6-C30 condensed polycyclic group including a heteroaromatic ring group, and p and q denote a mole ratio of each structural unit, and p/(p+q) is about 0.5 to about 0.95.

BRIEF DESCRIPTION OF THE DRAWINGS

Example embodiments will be more clearly understood from the following brief description taken in conjunction with the accompanying drawings.

FIG. 1 is a schematic cross-sectional diagram illustrating transistors according to some example embodiments;

FIG. 2 is a schematic cross-sectional diagram illustrating transistors according to other example embodiments;

FIG. 3 is a schematic cross-sectional diagram illustrating organic solar cells according to still other example embodiments;

FIG. 4 is $^1$H NMR spectrum of an organic semiconductor polymer represented by Chemical Formula 6-1 (3) according to Example 1;

FIG. 5 is $^1$H NMR spectrum of an organic semiconductor polymer represented by Chemical Formula 6-1 (2) according to Example 2;

FIG. 6 is UV-vis absorption spectrum of a film including the organic semiconductor polymer represented by Chemical Formula 6-1 (3) according to Example 1; and FIG. 7 is a graph illustrating a current density-voltage ($J_{sc}$-$V_{oc}$) measurement of an organic solar cell including a mixture of the organic semiconductor polymer represented by the Chemical Formula 6-1 (2) according to Example 2 and PCBM in a weight ratio of 1:1.

Figure 1:
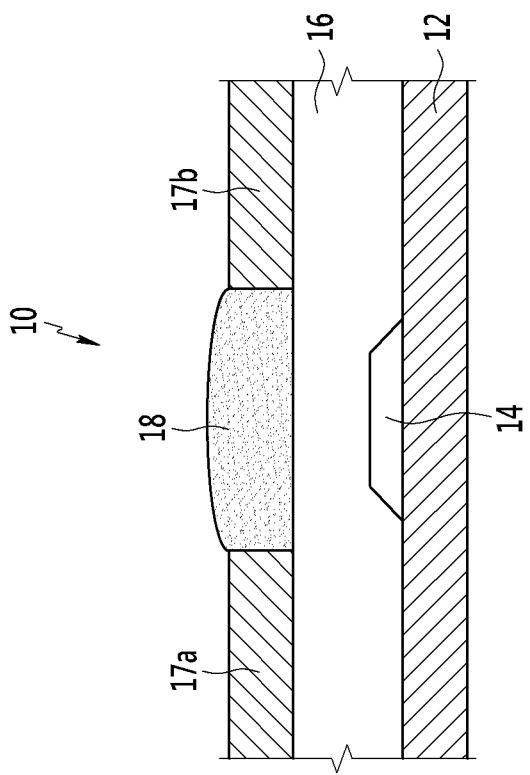
FIGS. 1-7 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term "heteroaromatic ring group" may refer to a C2-C30 heteroaryl group, a C3-C30 heterocycloalkenyl group, or a C3-C30 heterocycloalkynyl group. The term "condensed polycyclic group" may refer to a fused ring where at least one ring selected from a C3-C30 cycloalkyl group, a C3-C30 cycloalkenyl group, a C2-C30 heterocycloalkyl group, a C2-C30 heteroaryl group, and a C3-C30 heterocycloalkenyl group, and the heteroaromatic ring group are linked to each other. As used herein, when specific definition is not otherwise provided, the prefix "hetero" refers to one including heteroatoms selected from the group consisting of N, O, S, Si, and P, and including 1-4 heteroatoms in one ring.

As used herein, when specific definition is not otherwise provided, the term "substituted" refers to one substituted with at least one functional group selected from the group consisting of a fluoro group, a C1-C30 linear or branched alkyl group, a C3-C30 cycloalkyl group, a C1-C20 fluoroalkyl group, a C1-C20 perfluoroalkyl group ($C_nF_{2n+1}$), a C1-C30 linear or branched alkoxy group, a C3-C30 cycloalkoxy group, a C2-C30 linear or branched alkoxyalkyl group, a C4-C30 cycloalkoxyalkyl group, and a combination thereof, in a functional group or a compound.

According to at least one example embodiment, an organic semiconductor compound represented by the following Chemical Formula 1 is provided.

[Chemical Formula 1]

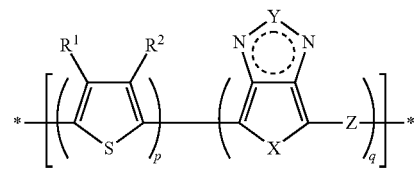

In Chemical Formula 1, $R^1$ and $R^2$ may each independently be selected from hydrogen, a halogen, a substituted or unsubstituted C1-C20 linear or branched alkyl group, a substituted or unsubstituted C3-C20 cycloalkyl group, a substituted or unsubstituted linear or branched C1-C20 alkoxy group, a substituted or unsubstituted C3-C20 cycloalkyloxy group, a substituted or unsubstituted C6-C30 aryl group, a substituted or unsubstituted C6-C30 aryloxy group, a substituted or unsubstituted C2-C30 heteroaryl group, and a combination thereof, or a C1-C20 alkyl group, a C1-C20 alkoxy group, or a C3-C20 cycloalkyl group, where one $CH_2$ group or two or more non-adjacent $CH_2$ groups may be substituted with —O—, —S—, —S(O)$_2$—, —CO—, —OCO—, —C(O)O—, —CR$^{51}$=CR$^{52}$—, —C≡C—, and —SiR$^{53}$R$^{54}$—, where $R^{51}$-$R^{54}$ are each independently selected from hydrogen, a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof, provided, as one example, that $R^1$ is not hydrogen X each may be independently selected from —CR$^3$=N—, —N=N—, —CR$^4$=CR$^5$—, —O—, —S—, —Se—, and —NR$^6$—, Y may be selected from —CR$^7$=CR$^8$—, —O—, —S—, —Se—, and —NR$^9$—. $R^3$-$R^9$ each may be independently selected from hydrogen, a halogen, a substituted or unsubstituted C1-C20 linear or branched alkyl group, a substituted or unsubstituted C3-C20 cycloalkyl group, a substituted or unsubstituted linear or branched C1-C20 alkoxy group, a substituted or unsubstituted C3-C20 cycloalkyloxy group, a substituted or unsubstituted C6-C30 aryl group, a substituted or unsubstituted C6-C30 aryloxy group, a substituted or unsubstituted C2-C30 heteroaryl group, and a combination thereof; a C1-C20 alkyl group, a C1-C20 alkoxy group, or a C3-C20 cycloalkyl group where one $CH_2$ group or two or more non-adjacent $CH_2$ groups may be substituted with —O—, —S—, —S(O)$_2$—, —CO—, —OCO—, —C(O)O—, —CR$^{51}$=CR$^{52}$—, —C≡C— and —SiR$^{53}$R$^{54}$— (where $R^{51}$-$R^{54}$ each may independently be selected from hydrogen, a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof); or when Y is —CR$^7$=CR$^8$—, adjacent $R^7$ and $R^8$ may be linked to each other to provide a fused ring.

Z may be a substituted or unsubstituted C1-C40 arylene group, a substituted or unsubstituted C4-C14 heteroaromatic ring group, or a substituted or unsubstituted C6-C30 condensed polycyclic group including a heteroaromatic ring group, and p and q may denote a mole ratio of each structural unit, and p/(p+q) may be about 0.5 to about 0.95, for example, about 0.6 to about 0.9 (e.g., about 0.7 to about 0.8). When p is within the range, the organic semiconductor compound may lower an energy band gap down to a desired range while maintaining coplanarity.

The organic semiconductor compound may include a structural unit represented by the following Chemical Formula 2.

[Chemical Formula 2]

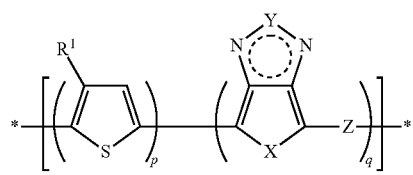

In Chemical Formula 2, $R^1$, X, Y, Z, p, and q may be the same as in Chemical Formula 1. In Chemical Formulae 1 and 2, p/(p+q) may be about 0.5 to about 0.95. In Chemical Formula 1, a thiophene structural unit having a $R^1$ substituent, a structural unit represented by the following Chemical Formula 1A, and an —Z— structural unit may be alternately arranged in the mole ratio (mole fraction). The thiophene structural unit with $R^1$ substituent may have regioregularity (a Head-to-Tail structure) where the $R^1$ substituent is regularly arranged at a specific site.

[Chemical Formula 1A]

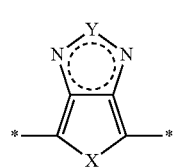

In Chemical Formula 1, the thiophene structural unit including an $R^1$ substituent may be included in an amount of about 0.5 or more based on the amount (p+q) of the total structural units, and may improve coplanarity of a compound and increase charge transfer. The organic semiconductor compound with excellent and/or improved coplanarity may bring about good and/or improved semiconductor characteristics and may be usefully applied to transistors. The $R^1$ substituent may have regioregularity and may improve interaction with an n-type structure and control intermolecular interaction. This organic semiconductor compound may have excellent and/or improved miscibility with CNT, fullerene, graphene, and the like and may be used in an organic solar cell and the like.

In Chemical Formulae 1 and 2, the structural unit represented by Chemical Formula 1A may be selected from the structural units represented by the following Chemical Formula 3. The structural unit represented by the above Chemical Formula 1A may decrease the band gap of an organic semiconductor compound.

[Chemical Formula 3]

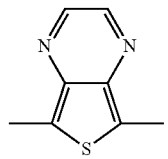
(3-1)

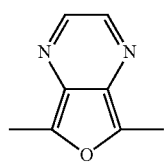
(3-2)

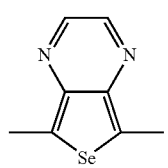
(3-3)

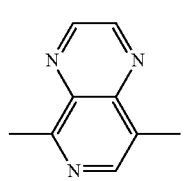
(3-4)

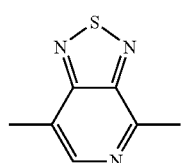
(3-5)

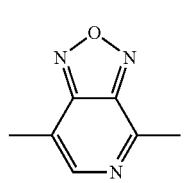
(3-6)

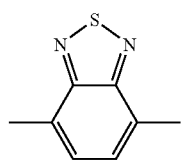
(3-7)

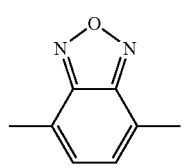
(3-8)

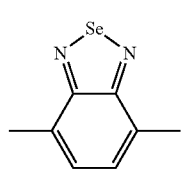
(3-9)

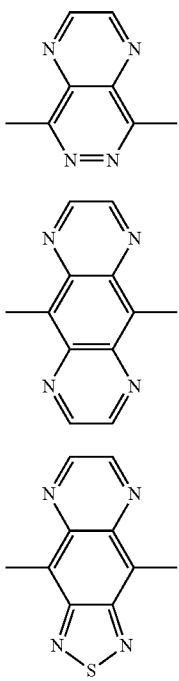

Hydrogen in each ring of Chemical Formula 3 may be substituted with a substituent selected from a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof.

The —Z— structural unit may control UV absorption coefficient. In Chemical Formulae 1 and 2, the —Z— structural unit may be at least one of the structural units represented by the following Chemical Formula 4.

[Chemical Formula 4]

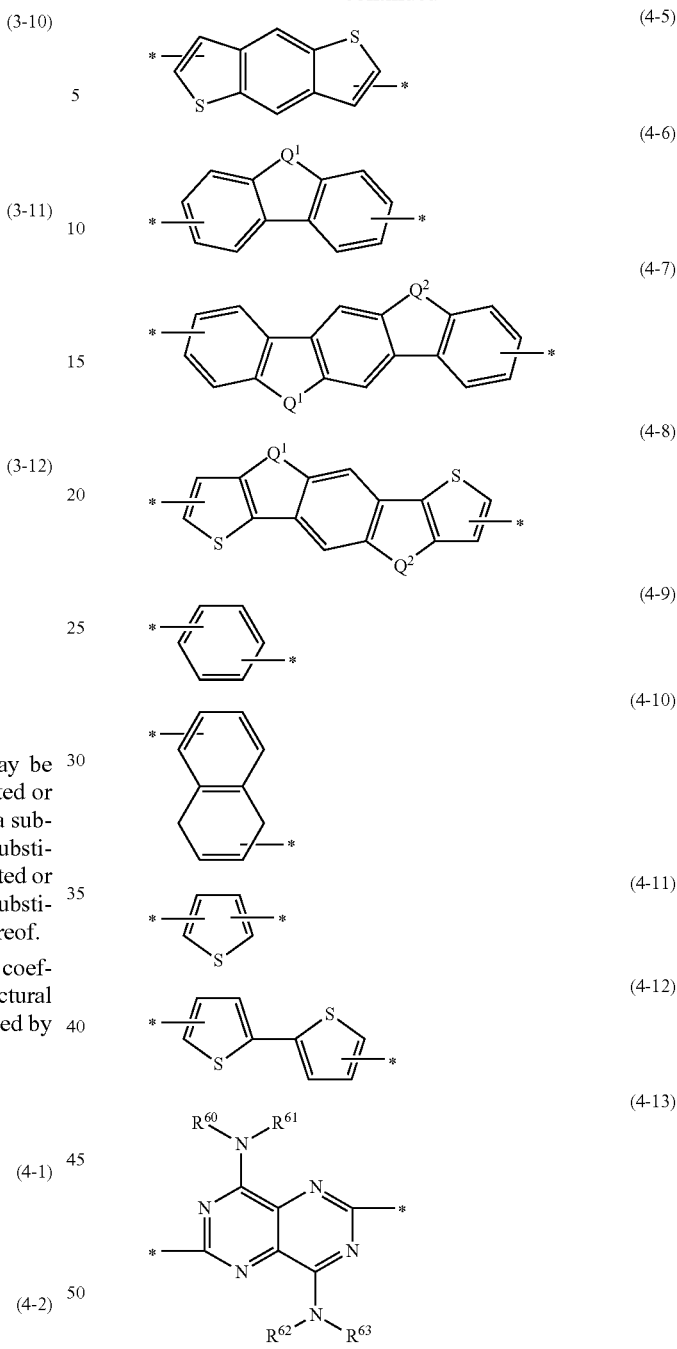

In Chemical Formula 4, $Q^1$ and $Q^2$ may each be S, $CR^{64}R^{65}$, $NR^{66}$ or $SiR^{67}R^{68}$, where $R^{60}$-$R^{68}$ are each independently selected from hydrogen, a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof. Hydrogen in each ring of Chemical Formula 4 may be substituted with a substituent selected from a substituted or unsubstituted C1-C15 linear or branched alkyl group, a substituted or unsubstituted C3-C15 cycloalkyl group, a substituted or unsubstituted C1-C15 alkoxy group, a substituted or unsubstituted C6-C15 aryl group, a substituted or unsubstituted C2-C15 heteroaryl group, and a combination thereof.

The organic semiconductor compound including structural units represented by the above Chemical Formulae 1 and 2 may include one of functional groups represented by Chemical Formulas 4-1 to 4-13 (Chemical Formula 4) and a combination thereof as a (e.g., an additional structural unit). The functional groups may have a different structure from the —Z— structural unit included in Chemical Formula 1 or 2. For example, a structural unit (Z') additionally included in Chemical Formula 1 may be represented in the following Chemical Formula 5.

[Chemical Formula 5]

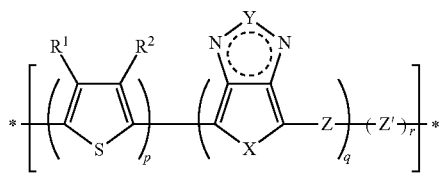

$R^1$, $R^2$, X, Y, Z, p, and q may be the same as in Chemical Formula 1, Z' may be at least one of functional groups represented by the above Chemical Formula 4, Z' may be different from Z, and r/(p+q+r) may be about 0.05 to about 0.2 or less, for example, about 0.05 to about 0.15. A —Z'— structural unit including the functional group may be included in an amount of about 20.0 moles or less based on 100 moles of the structural unit of Chemical Formula 1, and according to other example embodiments, in an amount of about 5 moles to about 15 moles. When the —Z'— structural unit including a functional group of Chemical Formula 4 is included within the range, the —Z'— structural unit may not deteriorate properties of an organic semiconductor compound and may also introduce various structural units.

The structural unit of Chemical Formula 1A in Chemical Formula 1 may be at least one of, for example, Chemical Formulae 3-1, 3-4 and 3-7. The —Z— structural unit in Chemical Formula 1 may be one of, for example, Chemical Formulae 4-1, 4-3, 4-5, 4-6, 4-8, 4-10, 4-11, and 4-12. The organic semiconductor compound including the structural unit represented by Chemical Formula 1 may include, for example, at least one of structural units represented by the following Chemical Formula 6.

[Chemical Formula 6]

(1)

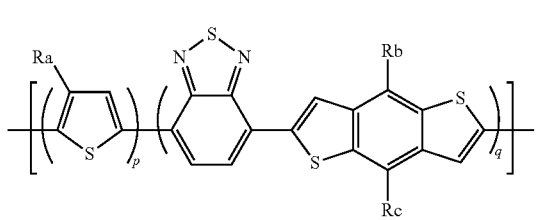

(2)

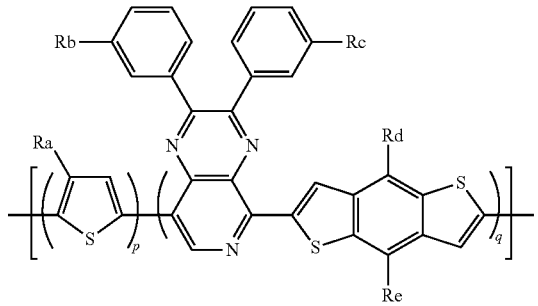

(3)

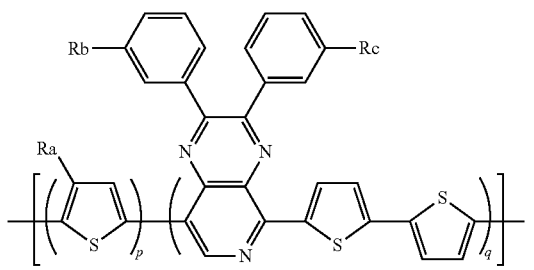

(4)

(5)

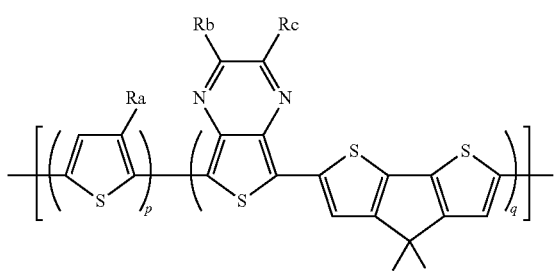

(6)

-continued
(7)
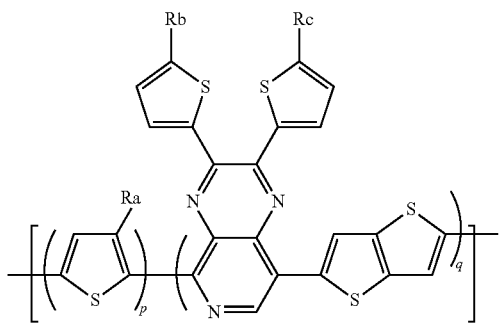
(8)
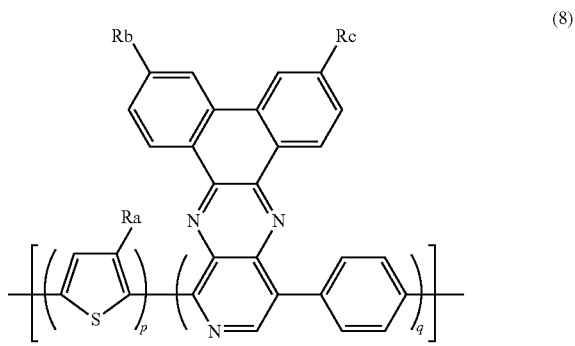
(9)
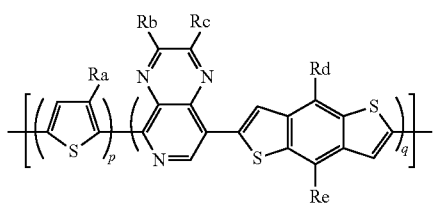
(10)
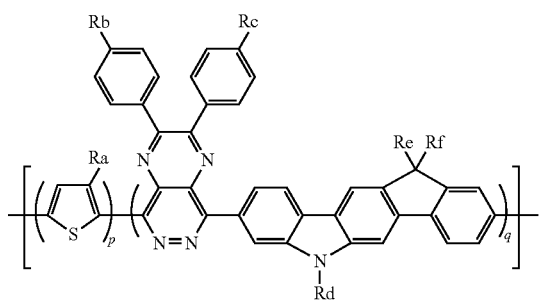
(11)
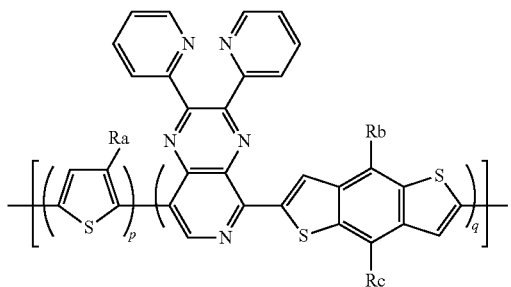
(12)
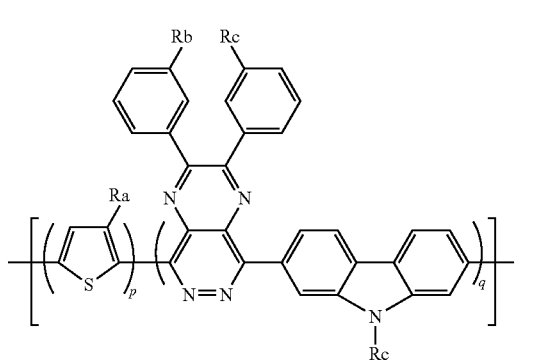
(13)
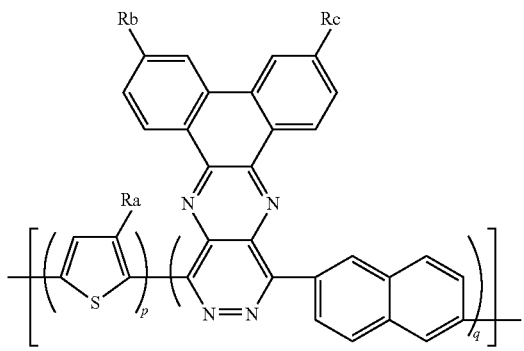
(14)
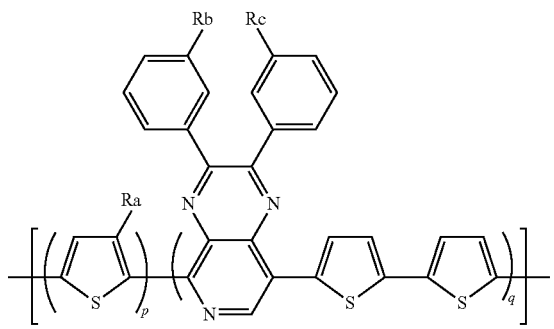

(15)

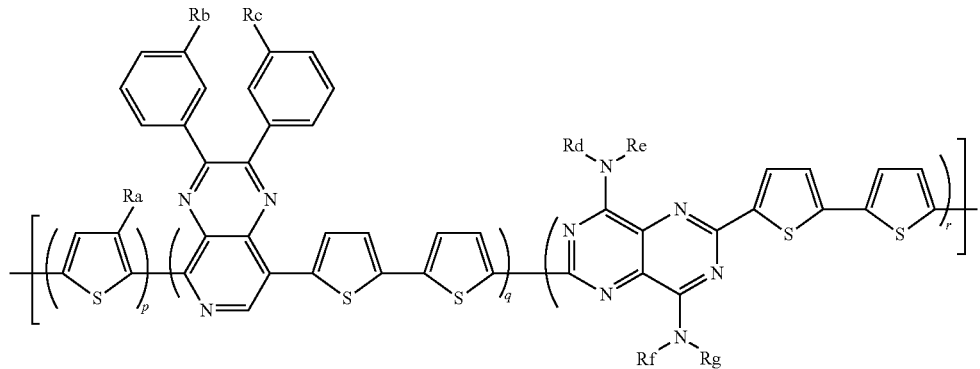

In Chemical Formula 6, Ra-Rg may each be independently selected from hydrogen, a substituted or unsubstituted C1-C20 linear or branched alkyl group, or a substituted or unsubstituted C1-C20 linear or branched alkoxy group, p, q and r may denote a mole ratio of each structural unit, p/(p+q) may be about 0.5 to about 0.95, for example, about 0.6 to about 0.9 (e.g., about 0.7 to about 0.8), and r/(p+q+r) may be about 0.2 or less, for example, about 0.05 to about 0.15.

The above Chemical Formula 6 may be, as one example, Chemical Formula 6-1.

[Chemical Formula 6-1]

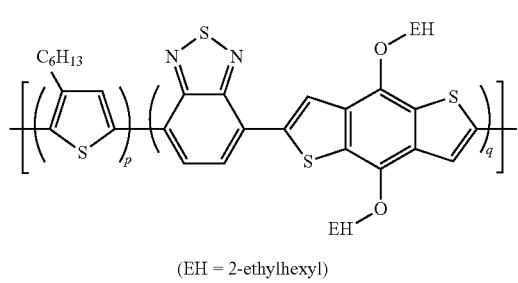

(1)

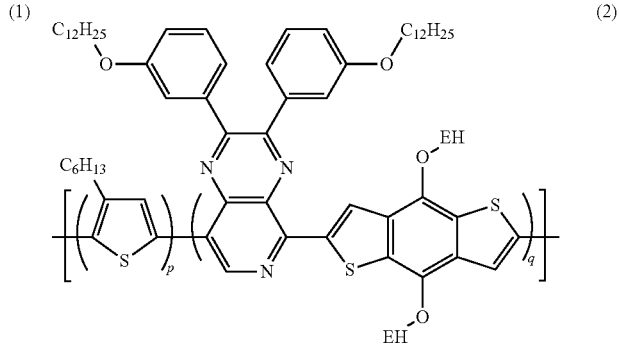

(2)

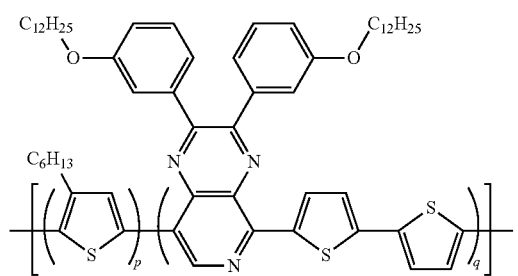

(3)

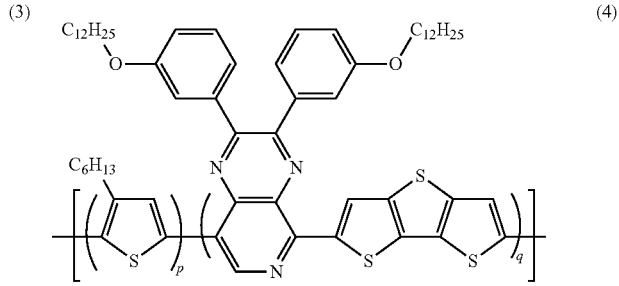

(4)

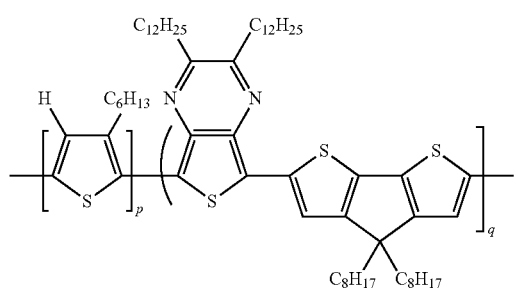

(5)

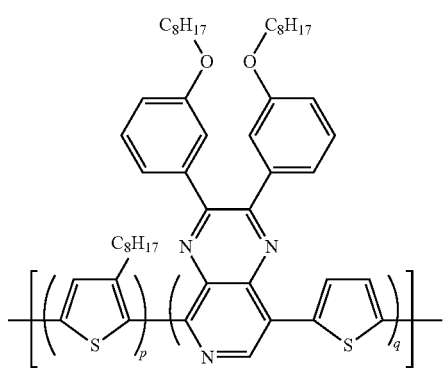

(6)

-continued
(7)
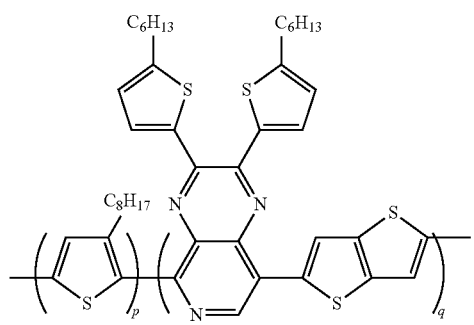
(8)
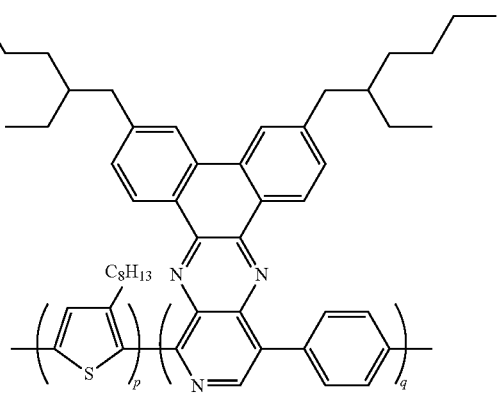
(9)
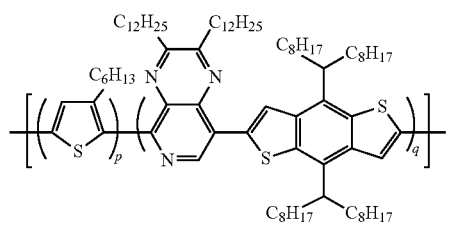
(10)
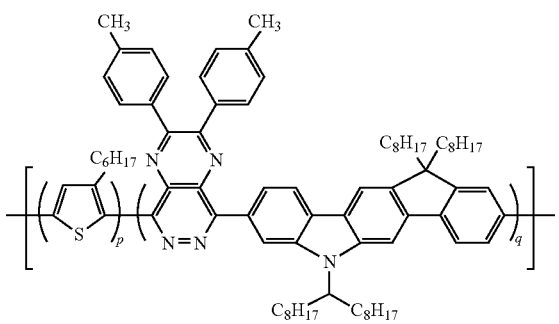
(11)
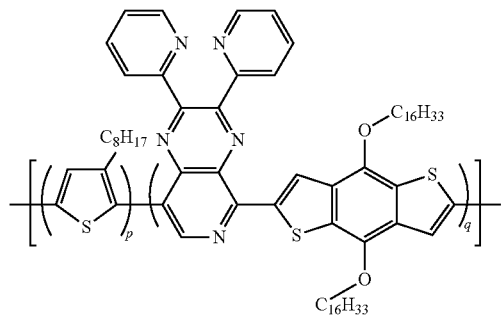
(12)
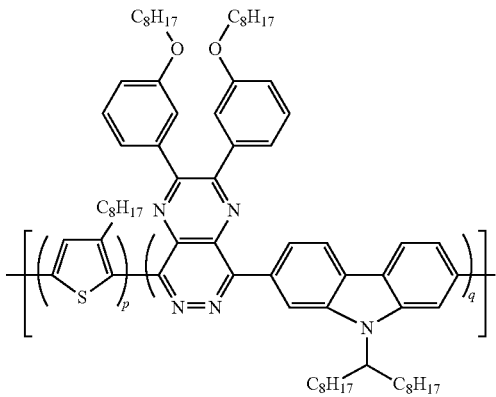
(13)
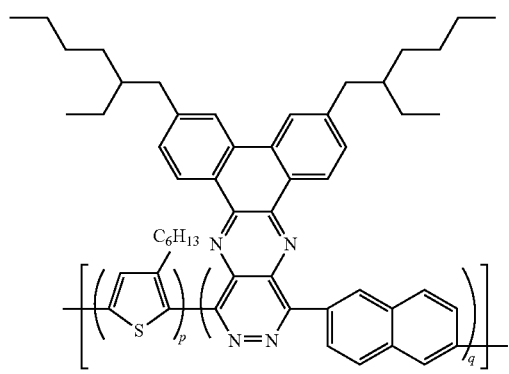
(14)
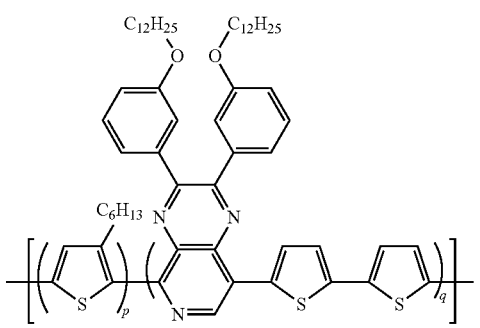

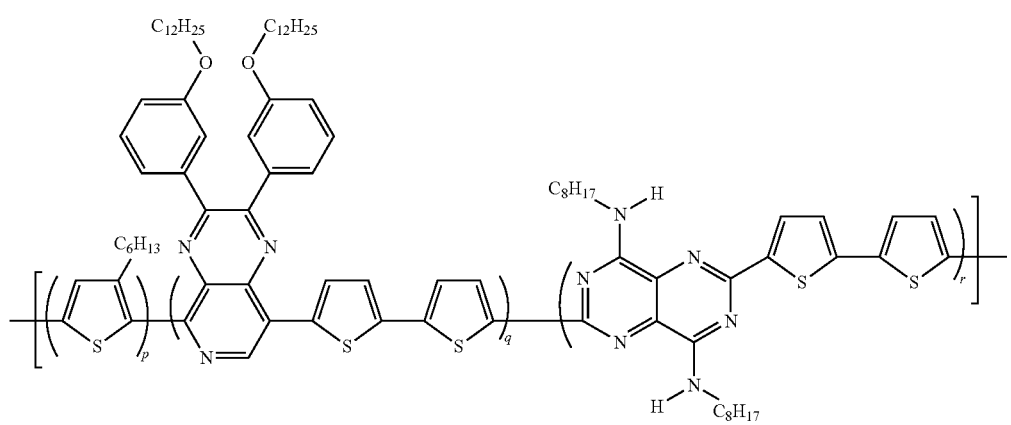
(15)

In Chemical Formula 6-1, p, q, and r may denote a mole ratio of each structural unit, and p/(p+q) may be about 0.5 to about 0.95, for example, about 0.6 to about 0.9, (e.g., about 0.7 to about 0.8). The variable r may have a value to make r/(p+q+r) about 0.2 or less but may be about 0.05 to about 0.15. A number average molecular weight (Mn) of the organic semiconductor compound may be about 5,000 to about 200,000, and a weight average molecular weight (Mw) of about 10,000 to about 500,000. The organic semiconductor compound may be a p-type organic semiconductor compound.

The substituted or unsubstituted C2-C30 heteroaryl group may be a C2-C30 heteroaromatic ring group including at least one electron withdrawing imine nitrogen atom and in particular, a functional group represented by the following Chemical Formula 7, but is not limited thereto.

[Chemical Formula 7]

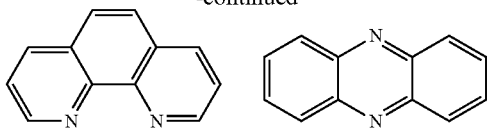

-continued

In Chemical Formula 7, Y may be hydrogen, a C1-C20 linear or branched alkyl group, or a C3-C20 cycloalkyl group, a C6-C30 aryl group, a C1-C16 linear or branched alkoxy group, or a C3-C16 cycloalkoxyalkyl group. However, there is no particular limit to a position where a substituent represented by the above Chemical Formula 7 is substituted for hydrogen of Chemical Formula 1 and may not be illustrated here.

Examples of the C2-C30 heteroaromatic ring group including at least one electron-withdrawing imine nitrogen atom may include a thiazolyl group, a thiadiazolyl group, an isoxazolyl group, an oxadiazolyl group, an imidazolyl group, a pyrazolyl group, a thiadiazolyl group, a trizolyl group, a tetrazolyl group, a pyridine group, a pyridazine group, a quinolinyl group, an isoquinolinyl group, a quinoxalinyl group, a naphthyridinyl group, a benzoimidazolyl group, a pyrimidopyrimidinyl group, a benzothiadiazolyl group, a benzoselenadiazolyl group, a benzotriazolyl group, a benzothiazolyl group, a benzooxazolyl group, a phenanthrolinyl group, a phenazinyl group, a phenanthridinyl group, and the like.

The substituted or unsubstituted C2-C30 heteroaryl group may be a C2-C30 heteroaromatic ring group including at least one sulfur atom and selected from the following Chemical Formula 8.

[Chemical Formula 8]

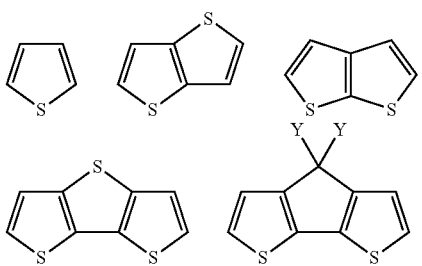

In Chemical Formula 8, Y may be hydrogen, a C1-C20 linear or branched alkyl group, or a C3-C20 cycloalkyl group, a C6-C30 aryl group, a C1-C16 linear or branched alkoxy group, or a C3-C16 cycloalkoxyalkyl group. When two or more Y are present, Y may be the same or different from each other. There is no particular limit to a position where a substituent represented by Chemical Formula 8 may be combined with Chemical Formula 1 and may not be illustrated here.

The organic semiconductor compound including the structural unit represented by Chemical Formula 1 may be prepared by conventional methods. The organic semiconductor compound including the structural unit represented by Chemical Formula 1 may be prepared through reactions of monomers as shown in the following Reaction Scheme 1.

[Reaction Scheme 1]

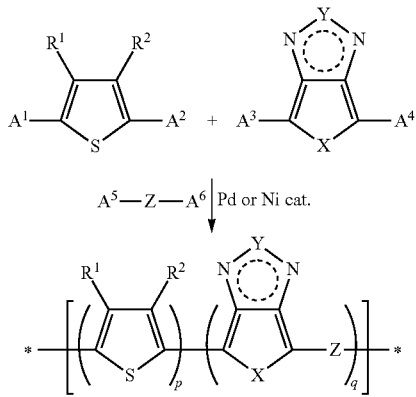

In the Reaction Scheme 1, $R^1$, $R^2$, X, Y, Z, p and q may be the same as in Chemical Formula 1, $A^1$-$A^6$ may be independently reactive groups, for example, a halogen (e.g., Br, I, Cl, and the like), trialkyltin, and borane, but are not limited thereto. Trialkyltin may be represented by the following Chemical Formula 9, and borane may be represented by the following Chemical Formula 10 or 11.

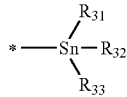

[Chemical Formula 9]

In Chemical Formula 9, $R_{31}$-$R_{33}$ may be the same or different and may independently be hydrogen or a C1-C7 alkyl group, provided that at least one of $R_{31}$-$R_{33}$ is an alkyl group.

[Chemical Formula 10]

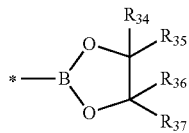

[Chemical Formula 11]

In Chemical Formula 11, $R_{34}$-$R_{37}$ may be the same or different and may independently be hydrogen or a C1-C7 alkyl group provided, as one example, that at least one of $R_{34}$-$R_{37}$ is an alkyl group.

A catalyst may be used in the reaction, of Reaction Scheme 1 and may be an organic metal catalyst represented by the following Chemical Formulae 12-1 to 12-4.

Pd(L$_1$)$_x$ [Chemical Formula 12-1]

Pd(L$_2$)$_{4-y}$Cl$_y$ [Chemical Formula 12-2]

In Chemical Formulae 12-1 and 12-2, $L_1$ and $L_2$ may be ligands, for example, triphenylphosphine (PPh$_3$), 1,4-bis(diphenylphosphine)butane (dppb), 1,1'-bis(diphenylphosphino)ferrocene (dppf), acetate (OAc), triphenyl arsine (AsPh$_3$), and triphenylphosphite (P(OPh)$_3$), where x may be an integer ranging from 2 to 4, inclusive, and y may be an integer ranging from 1 to 3, inclusive.

Ni(L$_3$)$_x$ [Chemical Formula 12-3]

Ni(L$_4$)$_{3-y}$Cl$_y$ [Chemical Formula 12-4]

In Chemical Formulae 12-3 and 12-4, $L_3$ and $L_4$ may be ligands, for example, a diphenylphosphinophosphinoalkane (e.g., 1,3-bis(diphenylphosphino)propane (dppp), 1,2-bis(diphenylphosphino)ethane (dppe), 1,4-diphenylphosphinobutane (dppb), and the like, and a cycloalkene (e.g., bis(1,5-cyclooctadiene) (COD), and the like)), where x may be an integer of 2 or 3, and y may be an integer of 1 or 2. Examples of palladium catalysts may include a palladium (0) catalyst (e.g., a tetrakis(triphenylphosphine)palladium (0) compound (Pd(PPh$_3$)$_4$)), and palladium (II) catalysts (e.g., 1,4-bis(triphenylphosphine)palladium (II) dichloride (PdCl$_2$PPh$_{32}$), [1,4-bis(diphenylphosphine)butane]palladium (II) dichloride (Pd(dppb)Cl$_2$), [1,1'-bis(diphenylphosphino)ferrocene] palladium (II) dichloride (Pd(dppf)Cl$_2$), palladium (II) acetate (Pd(OAc)$_2$), and the like).

Examples of nickel catalysts may include a nickel (0) catalyst (e.g., a bis(1,5-cyclooctadiene) nickel (0) compound (Ni(COD)$_2$)), and a nickel (II) catalyst (e.g., 1,3-diphenylphosphinopropane nickel (II) chloride (Ni(dppp)Cl$_2$), 1,2-bis(diphenylphosphino)ethane nickel (II) chloride (Ni(dppe)Cl$_2$), and the like). The catalyst may be used by adjusting its amount according to amounts of the monomers. For example, the tetrakistriphenylphosphine palladium (0) compound may be used in an amount of about 0.2 mol % to about 15 mol % with respect to monomers, and in at least one example embodiment, it may be used at about 2 mol % to about 10 mol % with respect to monomers.

A polymerization solvent, for example toluene, dimethylformamide (DMF), tetrahydrofuran (THF), N-methylpyrrolidone (NMP), and the like, may be used. The reaction of the Reaction Scheme 1 may be performed at about 80 to about 120° C. for about 6 to about 48 hours under a nitrogen atmosphere. The organic semiconductor compound may be applicable to an active layer of a transistor. The transistor may include a gate electrode on a substrate, a source electrode and a drain electrode facing each other and defining a channel region, an insulation layer that electrically insulates the source and drain electrodes from the gate electrode, and an active layer including the organic semiconductor compound in the channel region.

The active layer may be prepared by a solution process of a composition including an organic semiconductor compound, for example, screen printing, printing, spin coating, dipping, ink-jetting, and so on. When the active layer is obtained by a solution process, the process cost may be reduced. The active layer may be usefully applied to fabricate a large area device.

Figure 2:
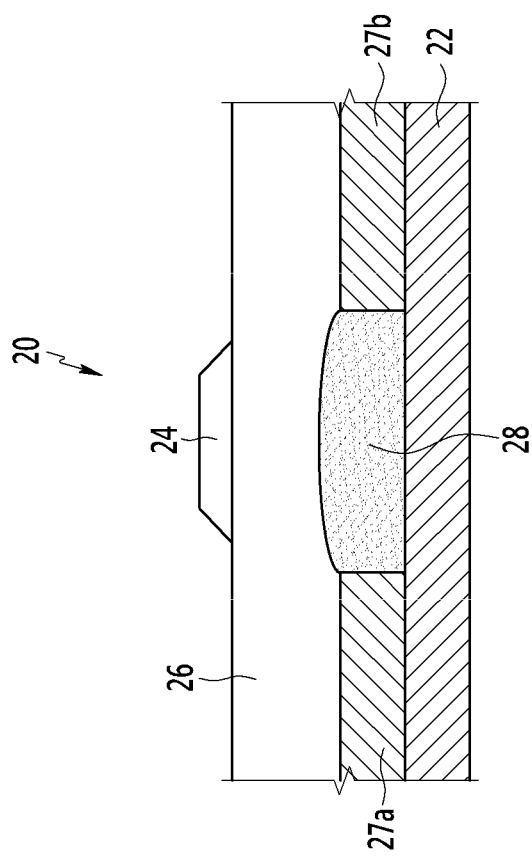

FIG. 1 and FIG. 2 are schematic cross-sectional diagrams illustrating transistors according to example embodiments. A transistor according to at least one example embodiment may be a thin film transistor. The thin film transistor may include a thin film with a thickness of several nm to several μm. Referring to FIG. 1, a transistor 10 may include a substrate 12, a gate electrode 14 on the substrate 12, and an insulation layer 16 covering the gate electrode 14. A source electrode 17a and a drain electrode 17b defining a channel region may be on the insulation layer 16. An active layer 18 may be in the channel region. The active layer 18 may include, for example, an organic semiconductor compound according to example embodiments.

Referring to FIG. 2, in a transistor 20, a source electrode 27a and a drain electrode 27b defining a channel region may be on a substrate 22, and an active layer 28 may be on the channel region. The active layer 28 may include an organic semiconductor compound according to example embodiments. An insulation layer 26 may cover the source electrode 27a, the drain electrode 27b, and the active layer 28. A gate electrode 24 may be on the insulation layer 26. The substrates 12 and 22 may include an inorganic material, an organic material, and/or a composite of an inorganic material and an organic material. The substrate organic material may include, for example, a plastic (e.g., polyethylenenaphthalate (PEN), polyethyleneterephthalate (PET), polycarbonate, polyvinylalcohol, polyacrylate, polyimide, polynorbornene, and polyethersulfone (PES)) and the inorganic material may include, for example, glass and/or metal.

The gate electrodes 14 and 24, source electrodes 17a and 27a, and drain electrodes 17b and 27b may include a generally-used metal and/or metal oxide, for example, gold (Au), silver (Ag), aluminum (Al), nickel (Ni), and/or indium tin oxide (ITO), but is not limited thereto. The insulation layers 16 and 26 may include a generally-used insulator of high dielectric constant, for example, a ferroelectric insulator (e.g., $Ba_{0.33}Sr_{0.66}TiO_3$ (BST, barium strontium titanate), $Al_2O_3$, $Ta_2O_5$, $La_2O_5$, $Y_2O_3$, $TiO_2$), an inorganic insulator (e.g., $PbZr_{0.33}Ti_{0.66}O_3$ (PZT), $Bi_4Ti_3O_{12}$, $BaMgF_4$, $SrBi_2(TaNb)_2O_9$, $Ba(ZrTi)O_3(BZT)$, $BaTiO_3$, $SrTiO_3$, $Bi_4Ti_3O_{12}$, $SiO_2$, $SiN_x$, AlON and so on), or an organic insulator (e.g., polyimide, benzocyclobutane (BCB), parylene, polyacrylate, polyvinylalcohol, polyvinylphenol, and so on), but is not limited thereto.

The organic semiconductor compound may be applicable to a memory device, an organic light emitting element (OLED), a photosensor, a laser device, and so on.

Figure 3:
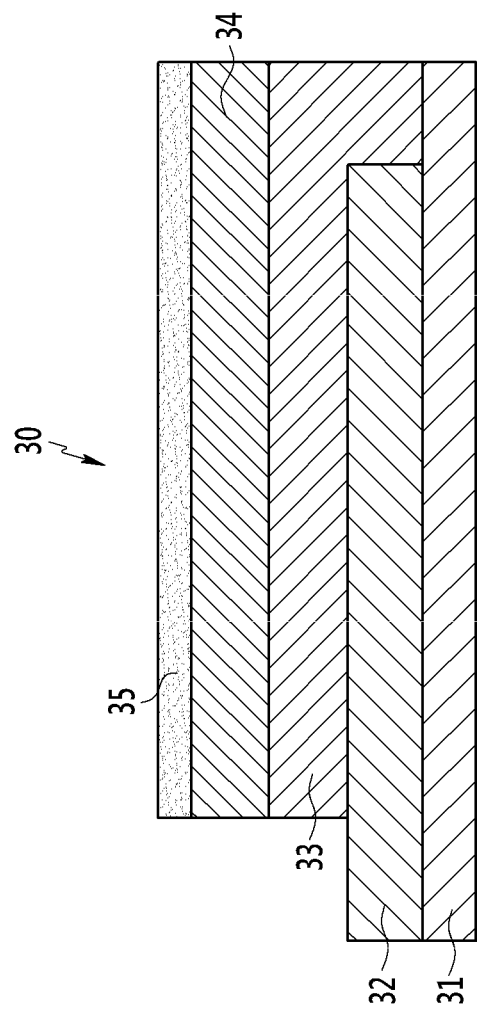

FIG. 3 is a schematic cross-sectional diagram illustrating organic solar cells according to still other example embodiments. Referring to FIG. 3, the organic solar cell 30 may include an anode 32 on a substrate 31. The substrate 31 may include any transparent material allowing an external light to enter without any particular limit. The transparent substrate 10 may be glass and/or a plastic. Examples of plastics may include polyethyleneterephthalate (PET), polyethylene naphthalate (PEN), polycarbonate (PC), polypropylene (PP), polyimide (PI), triacetyl cellulose (TAC), a copolymer thereof, and/or the like.

The anode 32 may be made of a high work function material for hole injection, for example, a transparent oxide (e.g., indium tin oxide (ITO), fluorine tin oxide (FTO), indium oxide, and/or the like). A hole transport layer (HTL) 33 may be on the anode 32. The hole transport layer (HTL) 33 may include a conductive polymer, for example, poly(3,4-ethylenedioxy-thiophene) (PEDOT) doped with poly(styrenesulfonate) (PSS) (PEDOT:PSS), polyaniline doped with poly(styrenesulfonic acid) (PAni:PSS), polypyrrole, poly(p-phenylenevinylene), poly[2-methoxy-5-(2'-ethyl-hexyloxy)-1,4-phenylene vinylene] (MEH-PPV), poly[2-methoxy-5-(3,7-dimethyloctyloxy)-1,4-phenylene-vinylene) (MDMO-PPV), poly(3-alkylthiophene), polythiophene, and the like, pentacene, CuPc, and/or a triphenyldiamine derivative (TPD).

A photoactive layer 34 may be on the hole transport layer (HTL) 33. The photoactive layer may include an electron donor (p-type semiconductor) material and an electron acceptor (n-type semiconductor) material. The electron donor may be one of the above-described organic semiconductor compounds. The electron acceptor may include fullerene with large electron affinity (C60, C70, C74, C76, C78, C82, C84, C720, C860), a fullerene derivative (e.g., 1-(3-methoxy-carbonyl)propyl-1-phenyl(6,6)C61 (PCBM)), or a mixture thereof.

The organic semiconductor compound and the electron acceptor may be mixed in the photoactive layer 34 and/or form a bilayered photoactive layer 34 including two separate thin films. The organic semiconductor compound and a carbon-based material may be mixed in a weight ratio of about 1:0.5 to about 1:4. When the organic semiconductor compound and the carbon-based material are mixed within the range, efficiency of an organic solar cell may be improved. The photoactive layer 34 may be formed using a common method of coating an organic semiconductor compound mixture and an electron acceptor, for example, spraying, spin coating, dipping, printing, doctor-balding, sputtering, and/or the like. A thickness of the photoactive layer 14 may be about 5 nm to about 2000 nm.

A cathode 35 may be on the photoactive layer 34. The cathode 35 may include an alkali metal (e.g., lithium (Li), sodium (Na), and/or the like), an alkali-earth metal (e.g., beryllium (Be), magnesium (Mg), and/or the like), aluminum (Al), transition elements (e.g., silver (Ag), gold (Au), cobalt (Co), iridium (Ir), nickel (Ni), osmium (Os), palladium (Pd), platinum (Pt), and/or the like) a rare earth element, a semi-metal (e.g., selenium (Se), and/or the like), a metal alloy (e.g., a sodium-potassium alloy, a magnesium-indium alloy, an aluminum-lithium alloy, and/or the like), LiF/Al, and/or the like. Although not shown in the drawing, an electron transport layer (ETL) may be further formed between the photoactive layer 34 and cathode 35.

A photocurrent may be generated when a light is absorbed in the photoactive layer 34 and excites an electron-hole pair, the excited electron-hole pair may be diffused and reach a interface of an electron-acceptor and an electron-donor and may be separated into electrons and holes due to an electron affinity difference of two materials at the interface. The electrons may move through the electron acceptor to a cathode 35 while the hole may move through the electron-donor to an anode 32.

The following examples are not limiting examples according to some example embodiments.

EXAMPLES

Synthesis Example 1

Monomer Synthesis

Synthesis Example 1-1

2,3-di(3-dodecyloxyphenyl)-5,8-dibromopyrido[3,4-b]pyrazine is synthesized referring to an article published by Bang-Lin Lee and Takakazu Yamamoto in Macromolecules 1999, 32, 1375-1382, which is herein incorporated in its entirety by reference.

$^1$H NMR (CDCl3, ppm): d 8.76 (s, 1H), 7.59-7.73 (m, Ph), 7.59-7.73 (m, Ph), 3.86 (t, 4H), 1.71 (m, 4H), 1.35 (m, 36H, CH29), 0.88 (t, 6H, CH3).

Synthesis Example 1-2

2,6-dichloro-4,8-bis(N-octylamino)pyrimido[5,4-d]pyrimidine is synthesized referring to an article published by Takakazu Yamamoto and Bang-Lin Lee in Macromolecules 2002, 35, 2993-2999, which is herein incorporated in its entirety by reference.

$^1$H NMR (CDCl3, ppm): d 6.86 (t, 2H, J=5.37 Hz, NH), 3.57 (q, 4H, J=6.25 Hz, N—CH2), 1.68 (m, 4H, CH2), 1.36 (m, 20H, CH25), 0.88 (t, 6H, CH3). 13C{1H} NMR (CDCl3, ppm): d 159.38 (4,8-C), 156.52 (2,6-C), 131.66 (4a, 8a-C), 41.20 (C1 of octyl group), 31.77 C2, 29.18 C3, 29.16 C4, 28.99 C5, 26.84 C6, 22.64 C7, 14.05 C8.

Synthesis Example 1-3

2-bromo-3-hexyl-5-trimethylstannylthiophene is synthesized as follows.

[Reaction Scheme 2]

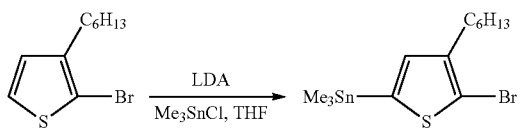

3-hexylthiophene is reacted with N-bromosuccinimide (hereinafter, NBS) in the same amount in chloroform at room temperature for about 15 hours, preparing 2-bromo-3-hexylthiophene. About 50 mmol of the 2-bromo-3-hexylthiophene is added with about 57 mmol of lithium diisopropylamine (hereinafter, LDA, about 2.0 M in a mixture of THF/hexane) to about 40 mL of an anhydrous THF solution during agitation at a temperature of about −80° C. to about −90° C. The resulting mixture is reacted at the same temperature for about 20 to about 30 minutes, and a THF solution of Me$_3$SnCl (about 50 mmol) is added thereto. The mixture is agitated at about −50° C. for about 1 hour. After the reaction, the agitated product is extracted with ether and water. The acquired organic layer is concentrated and distilled, obtaining 78% of a yield of a colorless oil product.

$^1$H NMR (300 MHz, CDCl3) δ (ppm) 0.34 (9H, CH$_3$), 0.88 (3H, CH$_3$), 1.31 (broad, 2nH, —CH$_2$n-), 1.56 (m, 2H, —CH$_2$—), 2.55 (t, 2H, Thiophene-CH$_2$—), 6.84 (s, Thiophene-H).

Synthesis Example 1-4

2,5-bis(trimethylstannyl)thiophene (m is 1 in the following reaction scheme 3) and 2,5-bis(trimethylstannyl)bithiophene (m is 2 in the following reaction scheme 3) is synthesized referring to a synthesis method illustrated in J. Org. Chem., 1984, 49, 5250, which is herein incorporated in its entirety by reference.

[Reaction Scheme 3]

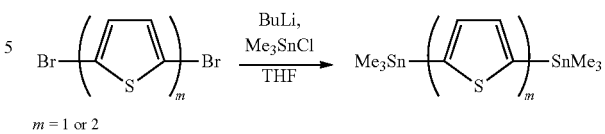

m = 1 or 2

Synthesis of 2,5-bis(trimethylstannyl)thiophene (m is 1 in the following reaction scheme 3): About 50 mL of a tetrahydrofuran (THF) solution prepared by using about 3.0 g (12.4 mmol) of dibromothiophene lowered down to about −50° C. under nitrogen atmosphere is added to about 18.4 mL (30 mmol) of n-butyl lithium (1.63 mol of n-BuLi in hexane). The mixture is reacted at the same temperature for about 30 minutes, and trimethylstannyl chloride (hereinafter, about 5 g (25 mmol) of Me$_3$SnCl,) is added thereto. The resulting mixture is reacted at about −50° C. for about 4-5 hours.

Water and ether are used to separate an organic layer. The organic layer is dried by removing the solvent therein. Recrystallization using ether is performed twice, obtaining about 3.1 g of white crystal (yield: 60%).

$^1$H-NMR (300 MHz, CDCl3) d (ppm) 0.38 (CH3, 18H), 7.38 (2H, Thiophene-H).

Synthesis Example 1-5

Synthesis of 2,5-bis(trimethylstannyl)bithiophene (m is 2 in the reaction scheme 3): 2,5-bis(trimethylstannyl)bithiophene is synthesized according to the same method as in Synthesis Example 1-4 except for using dibromo bithiophene instead of dibromothiophene.

$^1$H NMR (300 MHz, CDCl3) δ (ppm) 0.38 (CH3, 18H), 7.08 (d, 2H, Thiophene-H), 7.27 (d, 2H, Thiophene-H).

Example 1

Synthesis of an Organic Semiconductor Polymer Represented by the Following Chemical Formula 6-1 (3)

[Chemical Formula 6-1 (3)]

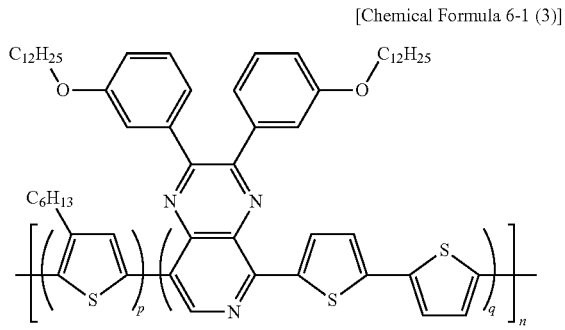

In Chemical Formula 6-1 (3), p/(p+q)=0.8, and n may indicate a polymerization degree.

[Reaction Scheme 4]

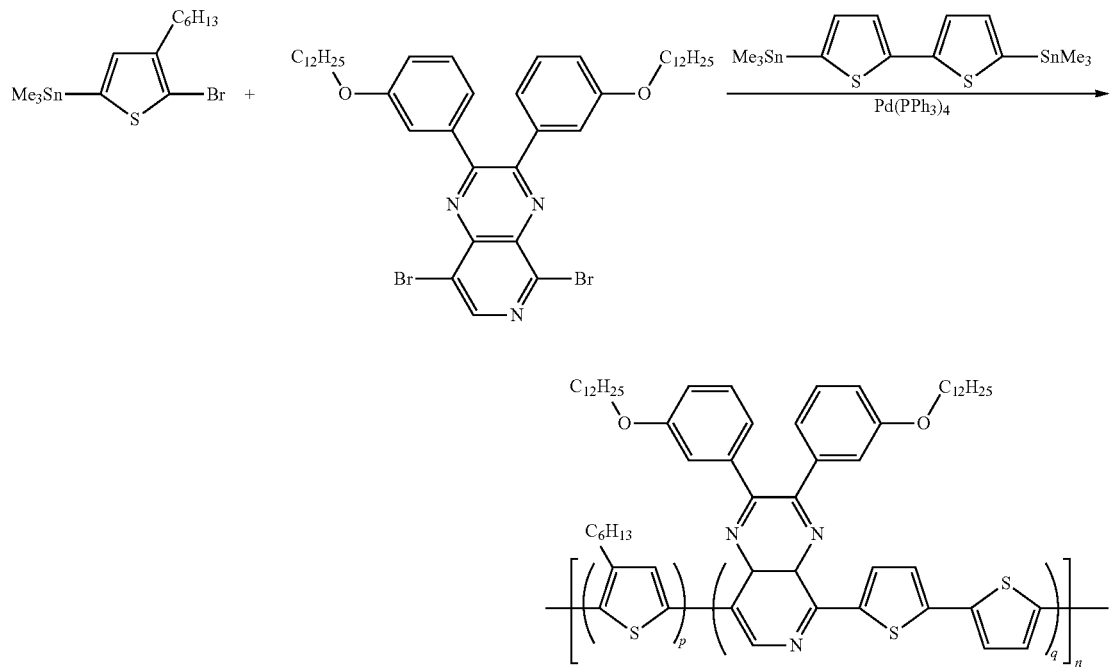

About 0.15 g (0.2 mmol) of 2,3-di(3-dodeyloxylphenyl)-5,8-dibromopyrido[3,4-b]pyrazine and about 0.33 g (0.8 mmol) of 2-bromo-3-hexyl-5-trimethylstannylthiophene synthesized according to Synthesis Example 1-3 are added to anhydrous dimethyl formamide (DMF) under a nitrogen atmosphere. While the mixture is lightly heated, about 0.08 g (0.2 mmol) of 2,5-bis(trimethylstannyl)bithiophene is prepared according to Synthesis Example 1-4. After the reaction mixture is completely dissolved, a palladium (0) compound, $Pd(PPh_3)_4$, as a polymerization catalyst is added thereto in an amount of about 0.1 g, that is, 7.0 mol % based on the total monomers. The resulting mixture is reacted at about 90° C. for about 12 hours.

The reaction solution is cooled down to room temperature and then, filtered, obtaining a polymer solid. The polymer solid is rinsed with a hydrochloric acid aqueous solution/chloroform twice, an ammonia aqueous solution/chloroform twice, and water/chloroform twice in order and then, restored by using methanol, acetone, methylenechloride, and chloroform in a Soxhlet extraction method. The polymer is dried, obtaining a red polymer (e.g., yield=45%, number average molecular weight=28,000, high temperature GPC, a polystyrene standard).

Figure 4:
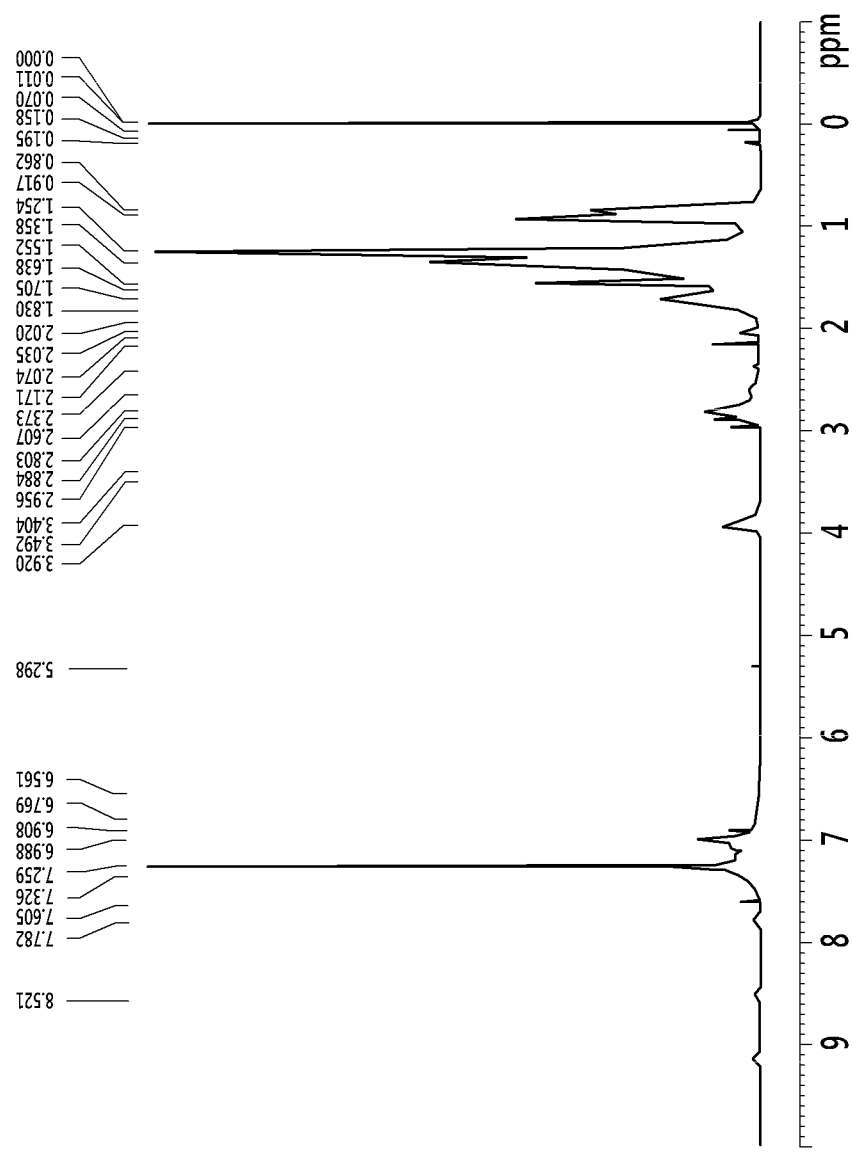

FIG. 4 is an $^1$H NMR spectrum of the organic semiconductor polymer represented by the above Chemical Formula 6-1 (3). $^1$H NMR (300 MHz, $CDCl_3$, ppm) δ: 0.86-1.83 (alkyl-CH2), 2.60 (Th—CH2, Head-to-Head), 2.80 (Th—CH2, Head-to-Tail), 3.92 (b, —O—CH2-), 6.76-7.60 (Th—H, Ph-H), 7.78 (b, Th—H), 8.52 (b, Th—H), 9.13 (s, pyrido[3,4-b]pyrazine-H).

Example 2

Synthesis of an Organic Semiconductor Polymer Represented by the Following Chemical Formula 6-1 (2)

[Chemical Formula 6-1 (2)]

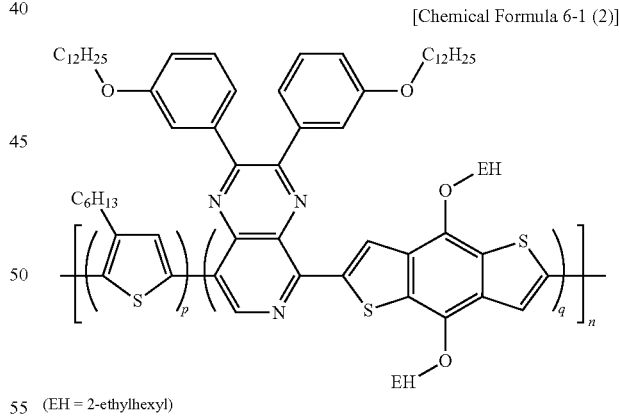

(EH = 2-ethylhexyl)

In Chemical Formula 6-1 (2), p/(p+q)=0.8, and n may indicate a polymerization degree. A navy polymer represented by Chemical Formula 6-1 (2) is synthesized according to the same method as in Example 1 except without using the tributylstannyl-bithiophene used in Example 1 (e.g., yield=52%, number average molecular weight=32,000, high temperature GPC, a polystyrene standard).

Figure 5:
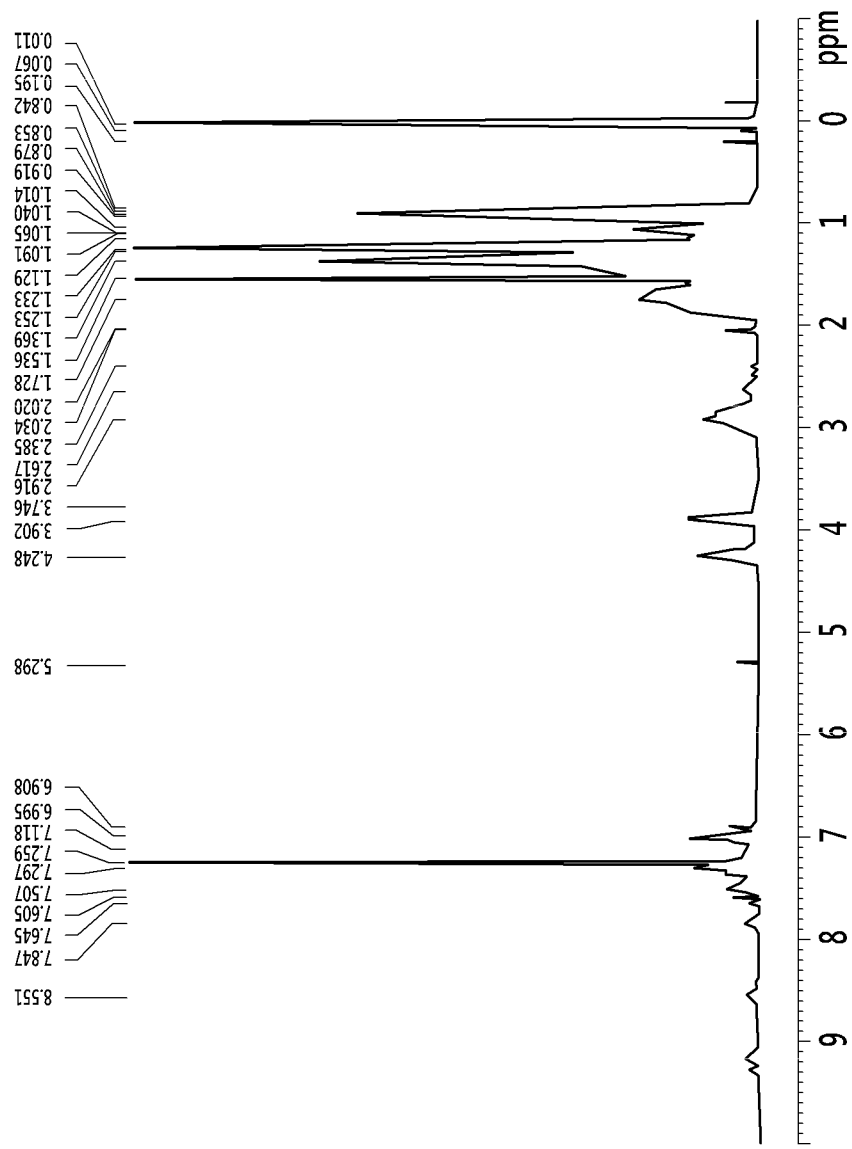

FIG. 5 illustrates $^1$H NMR spectrum of the organic semiconductor polymer represented by the above Chemical Formula 6-1 (2).

$^1$H NMR (300 MHz, CDCl$_3$, ppm) δ: 0.84-1.73 (alkyl-CH2), 2.60 (Th—CH2, Head-to-Head), 2.80 (Th—CH2, Head-to-Tail), 3.90 (b, —O—CH2-), 4.24 (b, —O—CH2-), 6.90-7.64 (Th—H, Ph-H), 7.84 (b, Th—H), 8.55 (b, Th—H), 9.13 (s, pyrido[3,4-b]pyrazine-H).

Example 3

Synthesis of an Organic Semiconductor Polymer Represented by the Following Chemical Formula 6-1 (1)

[Chemical Formula 6-1 (1)]

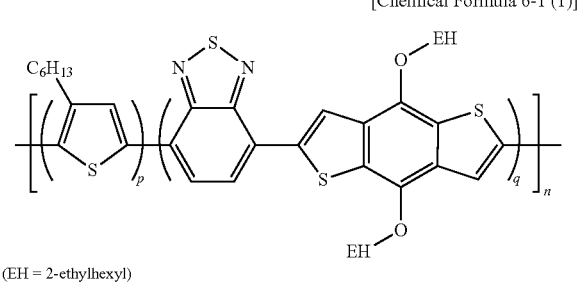

(EH = 2-ethylhexyl)

In Chemical Formula 6-1 (1), p/(p+q)=0.7, and n may indicate a polymerization degree. A navy polymer represented by Chemical Formula 6-1 (1) is synthesized according to the same method as in Example 1 except without using tributylstannyl-bithiophene (e.g., yield=42%, number average molecular weight=28,000, high temperature GPC, a polystyrene standard).

$^1$H NMR (300 MHz, CDCl$_3$, ppm) δ: 0.92-1.67 (alkyl-CH2), 2.60 (Th—CH2, Head-to-Head), 2.80 (Th—CH2, Head-to-Tail), 4.21 (b, —O—CH2-), 6.90-7.98 (Aromatic —H).

Example 4

Synthesis of an Organic Semiconductor Polymer Represented by the Following Chemical Formula 6-1 (15)

[Chemical Formula 6-1 (15)]

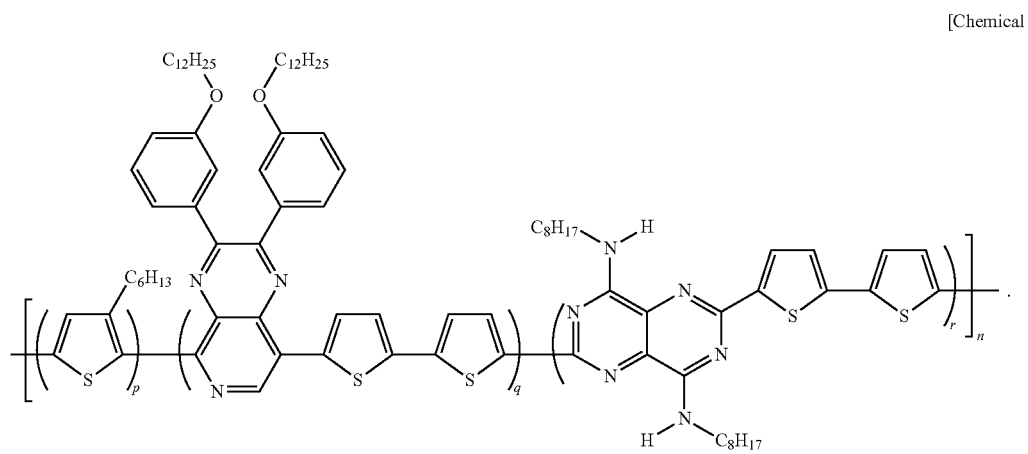

In Chemical Formula 6-1 (15), p/(p+q+r)=0.74, r/(p+q+r)=0.09, and n may indicate a polymerization degree.

[Reaction Scheme 5]

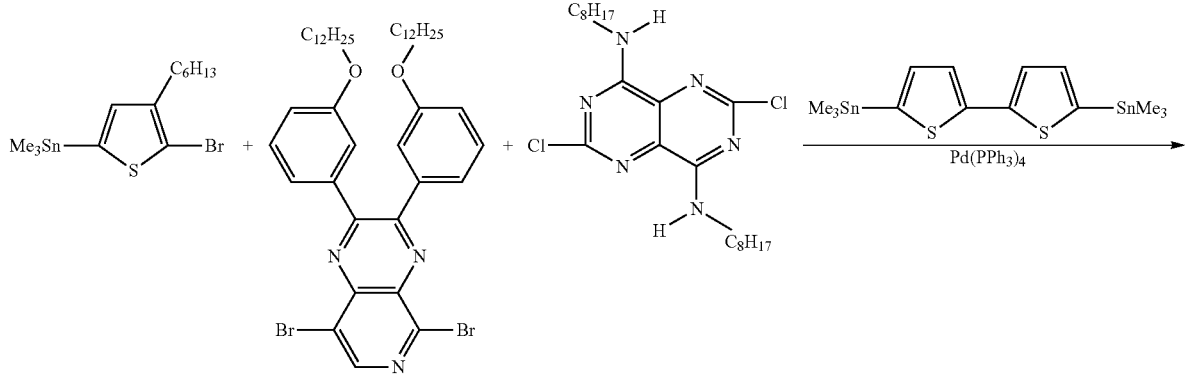

-continued

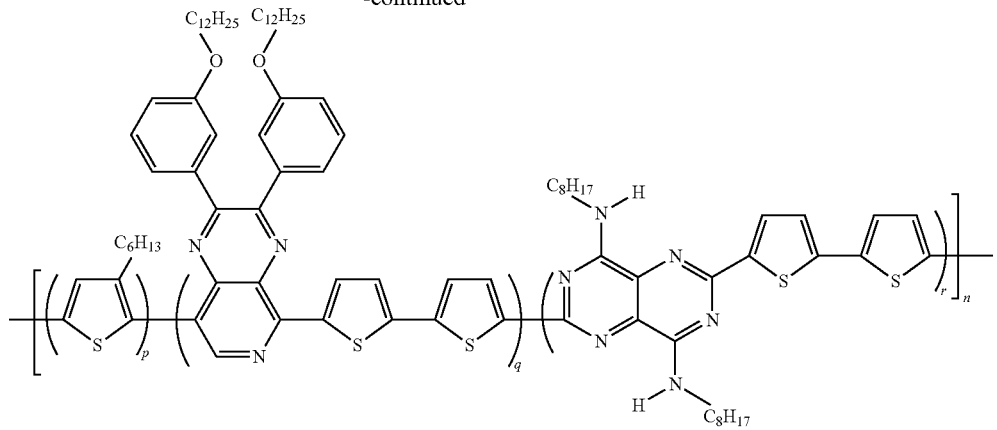

About 0.04 g (0.1 mmol) of 2,6-dichloro-4,8-bis(N-octylamino)pyrimido[5,4-d]pyrimidine according to Synthesis Example 2, about 0.41 g (1.0 mmol) of 2-bromo-3-hexyl-5-trimethylstannylthiophehe according to Synthesis Example 1-3, and about 0.19 g (0.25 mmol) of 2,3-di(3-dodeyloxylphenyl)-5,8-dibromopyrido[3,4-b]pyrazine) are added to anhydrous DMF in a reactor under nitrogen atmosphere. While the mixture is lightly heated, about 0.1 g (0.25 mmol) of 2,5-bis(trimethylstannyl)bithiophene according to Synthesis Example 1-5 is added thereto. When the reaction mixture is completely dissolved, $Pd(PPh_3)_4$, a palladium (0) compound as a polymerization catalyst is added thereto in an amount of about 0.1 g, (e.g., 7.0 mol % relative to total mole percent of the monomers). The mixture is reacted at about 90° C. for about 12 hours.

The reaction solution is cooled down to room temperature and is filtered, obtaining a polymer solid. The polymer solid is rinsed with a hydrochloric acid aqueous solution/chloroform twice, an ammonia aqueous solution/chloroform twice, and water/chloroform twice in order and is restored in a soxhlet extraction method by using methanol, acetone, methylenechloride, and chloroform. The resulting product is dried, obtaining a red polymer (e.g., yield=45%, number average molecular weight=23,000, high temperature GPC, a polystyrene standard). Referring to NMR analysis, the hexylthiophene may have a ratio between head-to-tail (HT):head-to-head (HH) of 0.89:0.11 with a significant regularity.

$^1$H NMR (300 MHz, CDCl3) δ (ppm): 0.92 —CH3, 1.10-1.72 (alkyl-CH2), 2.60 (Th—CH2, Head-to-Head), 2.81 (Th—CH2, Head-to-Tail), 3.94 (b, —O—CH2-, —N—CH2-), 6.95-7.43 (Th—H, Ph-H), 7.80 (b, Th—H), 8.53 (b, Th—H), 9.13 (s, pyrido[3,4-b]pyrazine-H).

The organic semiconductor polymers according to Examples 1-4 are respectively dissolved to have a concentration of about 1.0 wt % in chlorobenzene. The solution is coated in a spin-coating method. The coated product is baked at about 100° C. for about one hour under a nitrogen atmosphere to form a film.

Figure 6:
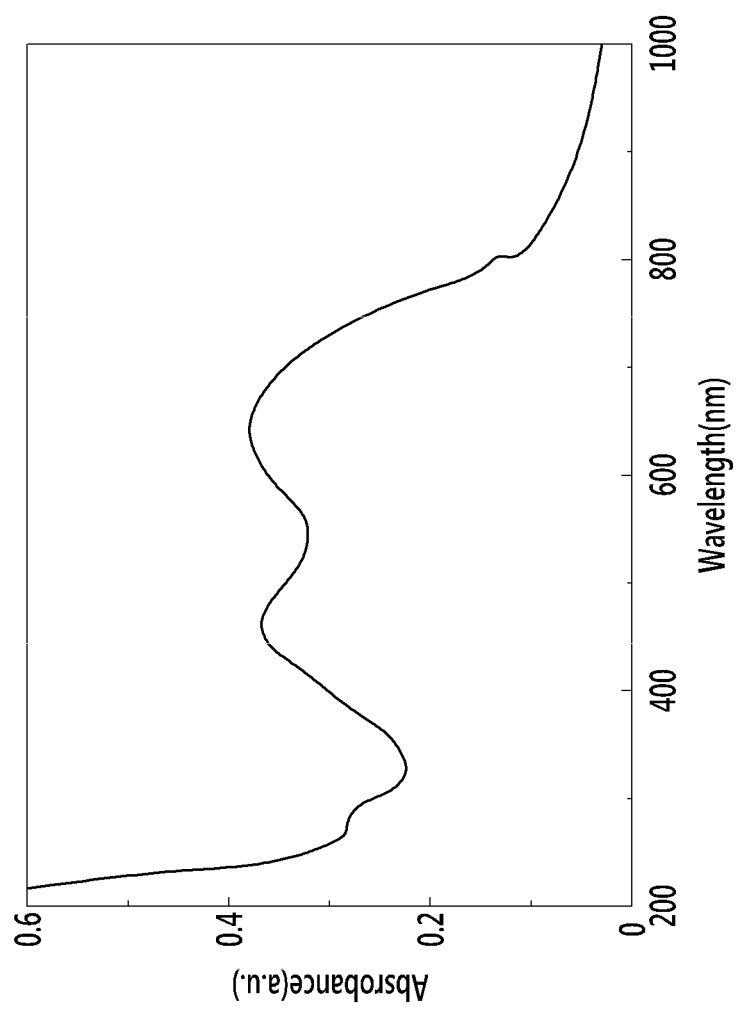

FIG. 6 illustrates UV-Vis absorption spectrum of the organic semiconductor compound according to Example 1. As shown in FIG. 6, the organic semiconductor compound has a broad absorption spectrum ranging from about 400 nm to about 800 nm.

Fabrication of an Organic Thin Film Transistor Using an Organic Semiconductor Polymer A glass substrate is cleaned, chromium used as a gate electrode is deposited thereon at a thickness of about 1000 Å using, for example, a sputtering method, and $SiO_2$ used as a gate insulating layer is deposited on the gate electrode at a thickness of about 1000 Å using, for example, a CVD method. Au used as a source-drain electrode is deposited at a thickness of about 1200 Å on the gate insulating layer using, for example, a sputtering method. The substrate is rinsed with isopropyl alcohol for about 10 minutes and is dried before depositing organic semiconductor polymers. The organic semiconductor polymers is dipped in an octadecyl trichlorosilane solution diluted to have about 10 mM of a concentration in chloroform for about 30 seconds, is rinsed with acetone, and dried, and each organic semiconductor polymer according to Example 1-4 is respectively dissolved to be about 1.0 wt % of a concentration in chlorobenzene. The solution is coated in a spin-coating method and is baked at about 150° C. for about one hour under a nitrogen atmosphere, fabricating an OTFT device.

Fabrication of an Organic Solar Cell Using an Organic Semiconductor Polymer

The organic semiconductor polymers according to Examples 1-4 is respectively mixed with a PCBM fullerene derivativeDeletedTexts([6,6]-phenyl-$C_{61}$-butyric acid methyl ester, a fullerene derivative) in a weight ratio of about 1:1 in a chlorobenzene solvent, preparing a solution with about 10 mg/mL of a concentration. An ITO surface is cleaned and PEDOT:PSS (e.g., a conventional ITO) is spin-coated to be about 40 nm thick. The coated ITO is baked at about 120° C. for about 60 minutes. The solution is spin-coated to be about 100 nm thick to form a photoactive layer on the PEDOT:PSS layer. LiF (about 0.6 nm)/Al (about 150 nm) is thermally deposited to form a cathode on the photoactive layer under about $1\times10^{-6}$ mbar of vacuum, fabricating an organic solar cell.

Each organic solar cell is measured regarding current density-voltage ($J_{sc}$-$V_{oc}$). The organic solar cells are operated using a conventional solar simulator, while being radiated by an AM 1.5 G solar light with an intensity of 100 mW/cm$^2$. The organic solar cell is measured regarding current density-voltage using a conventional source measurement unit. The intensity of the solar light is calibrated using a silicon solar cell as a reference.

Figure 7:
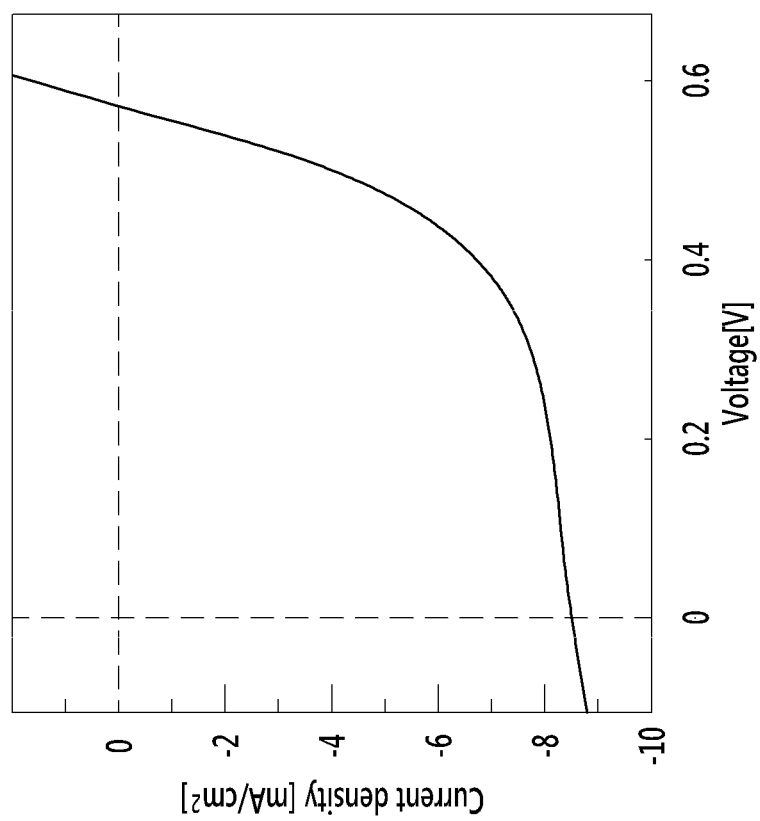

The organic solar cell including a mixture of the organic semiconductor polymer represented by Chemical Formula 6-1 according to Example 2 and PCBM in a weight ratio of 1:1 is measured regarding current density-voltage ($J_{sc}$-$V_{oc}$). The result is provided in FIG. 7. Based on the current density-voltage curved line of FIG. 7, the power conversion efficiency (PCE) of the organic solar cell is calculated using the following Equation 1.

$$PCE = FF \times \frac{V_{oc} I_{sc}}{P_{in}}$$ [Equation 1]

Herein, $V_{oc}$ may indicate open voltage of a solar cell, $I_{sc}$ may indicate a short-circuit current, FF may indicate a fill factor, and $P_{in}$ may indicate intensity of incident light in the solar cell. The organic solar cell including a mixture of the organic semiconductor polymer represented by Chemical Formula 6-1 (2) according to Example 2 and PCBM in a weight ratio of 1:1 shows efficiency of 2.85%.

While example embodiments have been particularly shown and described, it will be understood by one of ordinary skill in the art that variations in form and detail may be made therein without departing from the spirit and scope of the claims.

What is claimed is:

1. An organic semiconductor compound, comprising:
at least one structural unit according to Chemical Formula 1,

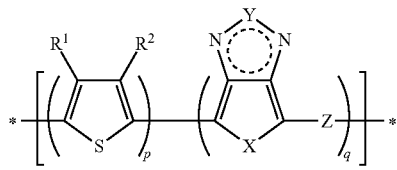

where, in Chemical Formula 1,
$R^1$ is one of
selected from a halogen, one of a first substituted and unsubstituted C1-C20 linear or branched alkyl group, one of a first substituted and unsubstituted C3-C20 cycloalkyl group, one of a first substituted and unsubstituted linear or branched C1-C20 alkoxy group, one of a first substituted and unsubstituted C3-C20 cycloalkyloxy group, one of a first substituted and unsubstituted C6-C30 aryl group, one of a first substituted and unsubstituted C6-C30 aryloxy group, one of a first substituted and unsubstituted C2-C30 heteroaryl group, and a combination thereof, and
selected from a C1-C20 alkyl group, a C1-C20 alkoxy group, and a C3-C20 cycloalkyl group,
where one of a first CH$_2$ group and a first plurality of non-adjacent CH2 groups are, if $R^1$ is not hydrogen, optionally substituted with —O—, —S—, —S(O)$_2$—, —CO—, —OCO—, —C(O)O—, —CR$^{51}$=CR$^{52}$—, —C≡C—, and —SiR$^{53}$R$^{54}$—,
where $R^{51}$-$R^{54}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof, and
$R^2$ is hydrogen; or
$R^1$ is hydrogen, and $R^2$ is one of
selected from a halogen, one of a first substituted and unsubstituted C1-C20 linear or branched alkyl group, one of a first substituted and unsubstituted C3-C20 cycloalkyl group, one of a first substituted and unsubstituted linear or branched C1-C20 alkoxy group, one of a first substituted and unsubstituted C3-C20 cycloalkyloxy group, one of a first substituted and unsubstituted C6-C30 aryl group, one of a first substituted and unsubstituted C6-C30 aryloxy group, one of a first substituted and unsubstituted C2-C30 heteroaryl group, and a combination thereof, and
selected from a C1-C20 alkyl group, a C1-C20 alkoxy group, and a C3-C20 cycloalkyl group,
wherein one of a first CH$_2$ group and a first plurality of non-adjacent CH2 groups are, if $R^1$ is not hydrogen, optionally substituted with —O—, —S—, —S(O)$_2$—, —CO—, —OCO—, —C(O)O—, —CR$^{51}$=CR$^{52}$—, —C≡C—, and —SiR$^{53}$R$^{54}$—,
wherein $R^{51}$-$R^{54}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof,
each X is independently selected from —CR$^3$=N—, —N=N—, —O—, —S—, —Sc—, and —NR$^6$—,
Y is selected from —CR$^7$=CR$^8$—, —O—, —S—, —Se—, and —NR$^9$—,
$R^3$ and $R^6$-$R^9$ are each independently one of
selected from hydrogen, a halogen, one of a second substituted and unsubstituted C1-C20 linear or branched alkyl group, one of a second substituted and unsubstituted C3-C20 cycloalkyl group, one of a second substituted and unsubstituted linear or branched C1-C20 alkoxy group, one of a second substituted and unsubstituted C3-C20 cycloalkyloxy group, one of a second substituted and unsubstituted C6-C30 aryl group, one of a second substituted and unsubstituted C6-C30 aryloxy group, one of a second substituted and unsubstituted C2-C30 heteroaryl group, and a combination thereof,
selected from a C1-C20 alkyl group, a C1-C20 alkoxy group, and a C3-C20 cycloalkyl group,
where one of a second CH2 group and a second plurality of non-adjacent CH$_2$ groups are optionally substituted with —O—, —S—, —S(O)$_2$—, —CO—, —OCO—, —C(O)O—, —CR$^{51}$=CR$^{52}$—, —C≡C—, and —SiR$^{53}$R$^{54}$—,
where $R^{51}$-$R^{54}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof, and
Z is selected from one of a substituted and unsubstituted C1-C40 arylene group, one of a substituted and unsubstituted C4-C14 heteroaromatic ring group, and one of a substituted and unsubstituted C6-C30 condensed polycyclic group including a heteroaromatic ring group, and
p and q denote a mole ratio of each structural unit, and p/(p+q) is about 0.5 to about 0.95.

2. The organic semiconductor compound of claim 1, wherein the organic semiconductor compound comprises a structural unit according to Chemical Formula 2,

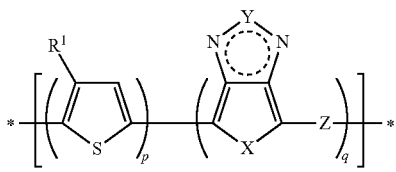

in Chemical Formula 2, $R^1$ is one of
selected from a halogen, one of a first substituted and unsubstituted C1-C20 linear or branched alkyl group, one of a first substituted and unsubstituted C3-C20 cycloalkyl group, one of a first substituted and unsubstituted linear or branched C1-C20 alkoxy group, one of a first substituted and unsubstituted C3-C20 cycloalkyloxy group, one of a first substituted and unsubstituted C6-C30 aryl group, one of a first substituted and unsubstituted C6-C30 aryloxy group, one of a first substituted and unsubstituted C2-C30 heteroaryl group, and a combination thereof, and selected from a C1-C20 alkyl group, a C1-C20 alkoxy group, and a C3-C20 cycloalkyl group, where one of a first $CH_2$ group and a first plurality of non-adjacent $CH_2$ groups are, if $R^1$ is not hydrogen, optionally substituted with —O—, —S—, —S(O)$_2$—, —CO—, —OCO—, —C(O)O—, —CR$^{51}$=CR$^{52}$—, —C≡C—, and —SiR$^{53}$R$^{54}$—, where $R^{51}$-$R^{54}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof, X, Y, Z, p, and q are the same as in Chemical Formula 1.

3. The organic semiconductor compound of claim 1, wherein p/(p+q) is about 0.6 to about 0.9.

4. The organic semiconductor compound of claim 2, wherein in Chemical Formulae 1 and 2, a structural unit according to Chemical Formula 1A is selected from the structural units according to Chemical Formula 3,

[Chemical Formula 1A]

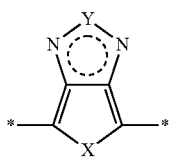

(3-1)

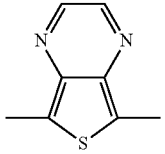

(3-2)

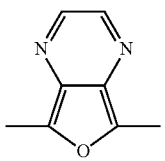

-continued (3-3)

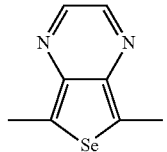

(3-4)

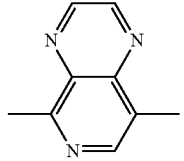

(3-5)

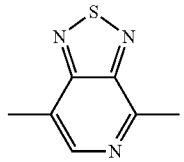

(3-6)

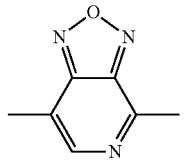

(3-10)

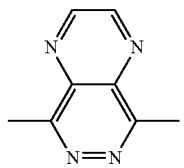

(3-11)

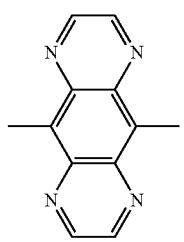

(3-12)

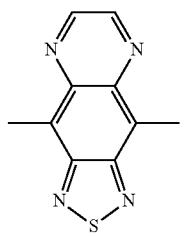

Formula 3 is optionally substituted with a substituent selected from one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof.

5. The organic semiconductor compound of claim 4, wherein in Chemical Formulae 1 and 2, a —Z— structural unit is at least one of the structural units according to Chemical Formula 4,

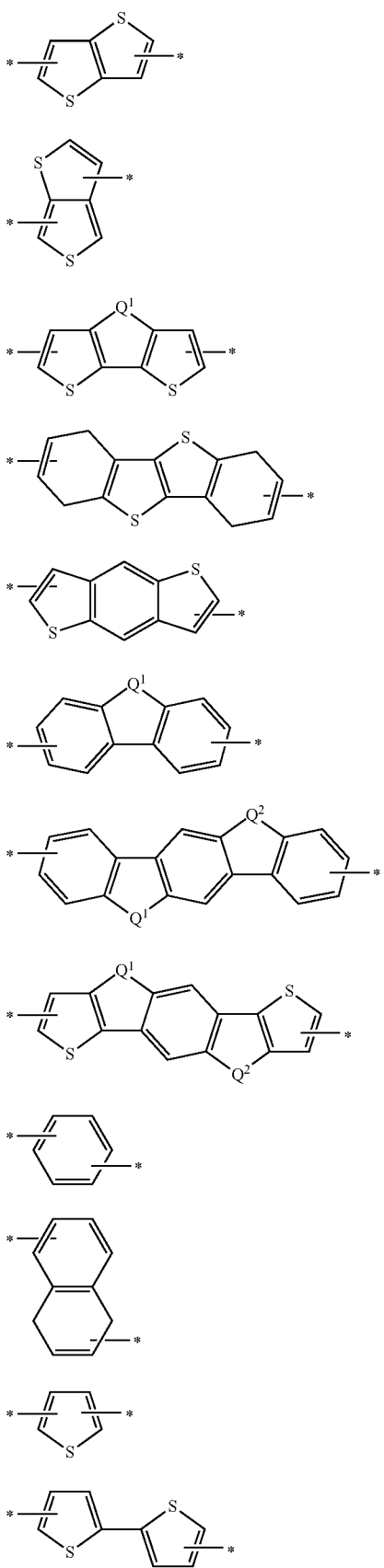

(4-1)
(4-2)
(4-3)
(4-4)
(4-5)
(4-6)
(4-7)
(4-8)
(4-9)
(4-10)
(4-11)
(4-12)

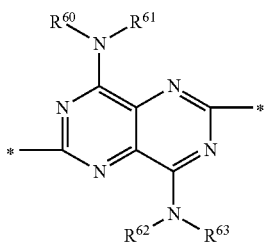

(4-13)

in Chemical Formula 4, $Q^1$ and $Q^2$ are each one of S, $CR^{64}R^{65}$, $NR^{66}$, and $SiR^{67}R^{68}$, $R^{60}$-$R^{68}$ are each independently selected from hydrogen, one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof, and hydrogen in each ring of Chemical Formula 4 is optionally substituted with a substituent selected from one of a substituted and unsubstituted C1-C15 linear or branched alkyl group, one of a substituted and unsubstituted C3-C15 cycloalkyl group, one of a substituted and unsubstituted C1-C15 alkoxy group, one of a substituted and unsubstituted C6-C15 aryl group, one of a substituted and unsubstituted C2-C15 heteroaryl group, and a combination thereof.

6. The organic semiconductor compound of claim 5, comprising a structural unit according to Chemical Formula 5,

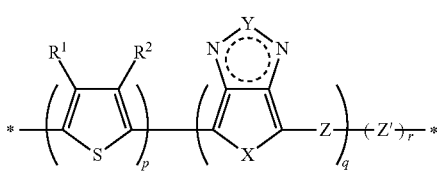

in Chemical Formula 5, $R^1$, $R^2$, X, Y, Z, p, and q are the same as in Chemical Formula 1, Z' is at least one functional group according to Chemical Formula 4, Z' being different from Z, and r/(p+q+r) is less than about 0.2.

7. The organic semiconductor compound of claim 5, wherein the structural unit of Chemical Formula 1A is at least one of Chemical Formulae 3-1, and 3-4, and the —Z— structural unit is one of Chemical Formulae 4-1, 4-3, 4-5, 4-6, 4-8, 4-10, 4-11, or 4-12.

8. The organic semiconductor compound of claim 1, wherein the organic semiconductor compound including the structural unit according to Chemical Formula 1 comprises at least one of structural units according to Chemical Formula 6, (1) 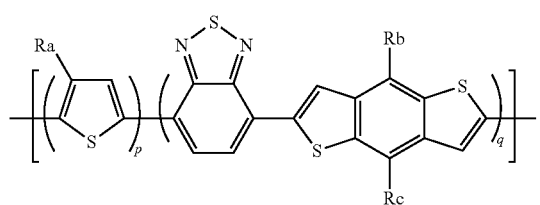
(2) 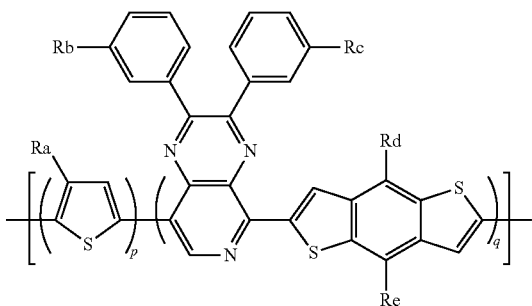
(3) 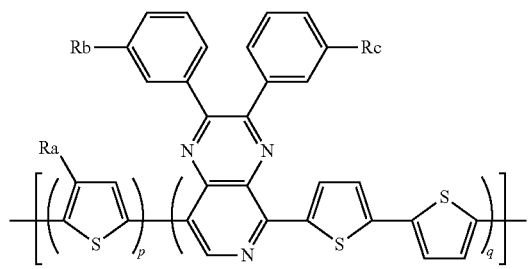
(4) 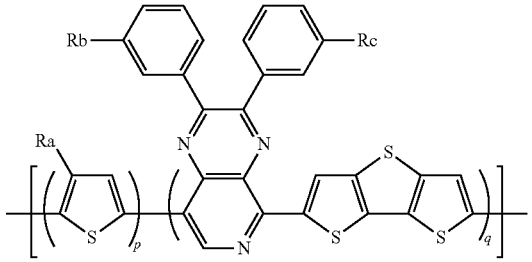
(5) 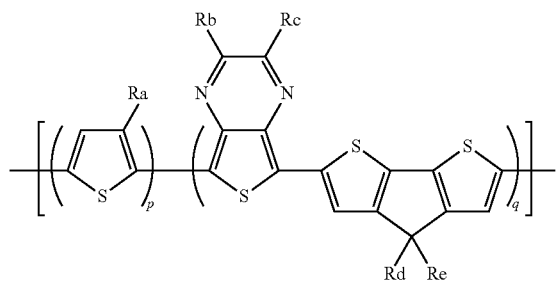
(6) 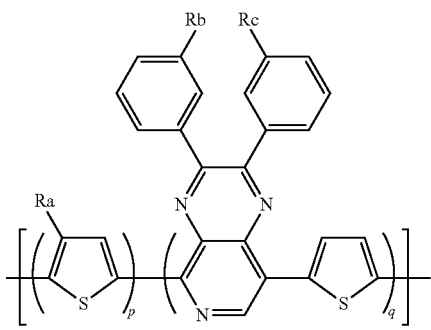
(7) 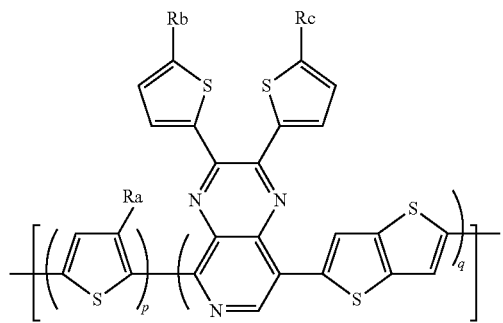
(8) 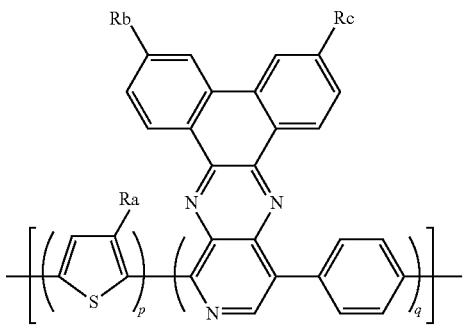
(9) 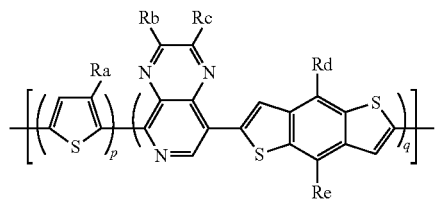
(10) 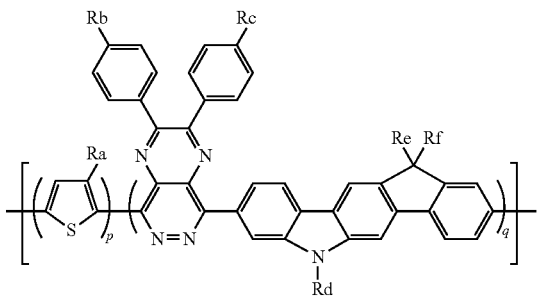

-continued

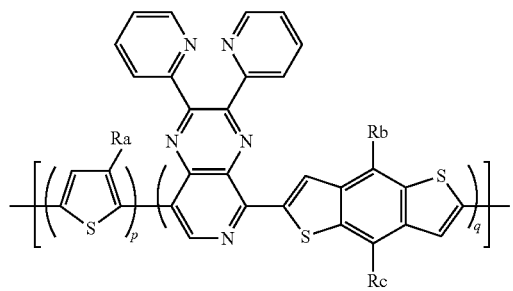 (11)

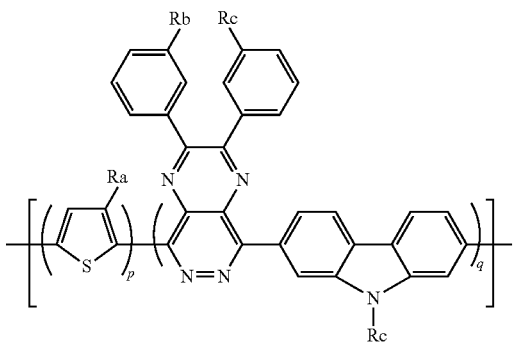 (12)

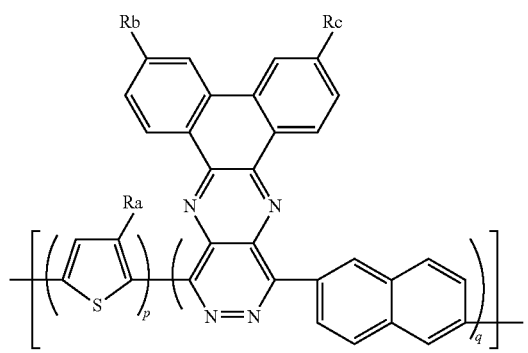 (13)

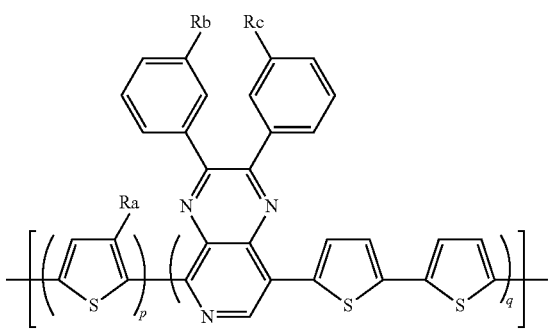 (14)

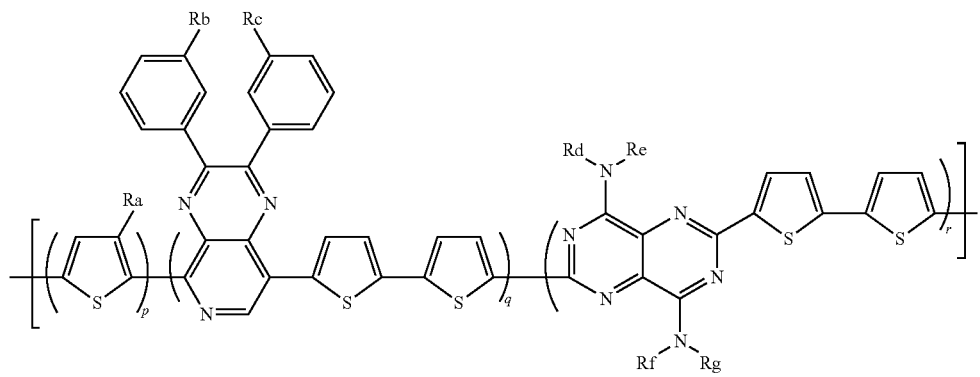 (15)

in Chemical Formula 6, Ra-Rg are each independently selected from hydrogen, one of a substituted and unsubstituted C1-C20 linear or branched alkyl group, and one of a substituted and unsubstituted C1-C20 linear or branched alkoxy group, p/(p+q) is about 0.5 to about 0.95, and r/(p+q+r) is less than about 0.2.

9. The organic semiconductor compound of claim 1, wherein a number average molecular weight (Mn) of the organic semiconductor compound is about 5,000 to about 200,000.

10. The organic semiconductor compound of claim 1, wherein a weight average molecular weight (Mw) of the organic semiconductor compound is about 10,000 to about 500,000.

11. The organic semiconductor compound of claim 1, wherein the organic semiconductor compound is p-type.

12. A transistor comprising the organic semiconductor compound of claim 1.

13. The transistor of claim 12, wherein the transistor includes:
   source and drain electrodes on a substrate;
   a gate electrode between the source and drain electrodes;
   an insulation layer separating the source electrode, the drain electrode, and the gate electrode; and
   an active layer including the organic semiconductor compound in a channel region between the source and drain electrodes.

14. An electronic device comprising the organic semiconductor compound of claim 1.

15. The electronic device of claim 14, wherein the electronic device is a solar cell.

16. The organic semiconductor compound of claim 1, wherein p/(p+q) is about 0.7 to about 0.9.

* * * * *